(12) United States Patent
Yamazaki

(10) Patent No.: US 7,664,168 B2
(45) Date of Patent: Feb. 16, 2010

(54) DATA CARRIER DEVICE, DATA CARRIER DRIVING DEVICE, DATA COMMUNICATION SYSTEM USING DATA CARRIER DRIVING DEVICE AND DATA COMMUNICATION METHOD

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 780 days.

(21) Appl. No.: 11/267,131

(22) Filed: Nov. 7, 2005

(65) Prior Publication Data
US 2006/0098691 A1    May 11, 2006

(30) Foreign Application Priority Data
Nov. 9, 2004 (JP) ............... 2004-325305
Nov. 30, 2004 (JP) ............... 2004-347074

(51) Int. Cl.
H04B 1/38 (2006.01)
(52) U.S. Cl. ............. 375/220; 375/223; 375/271; 375/268; 375/294
(58) Field of Classification Search ......... 375/223, 375/271, 268, 294, 220
See application file for complete search history.

(56) References Cited

U.S. PATENT DOCUMENTS

| 5,600,634 | A | 2/1997 | Satoh et al. |
| 5,828,703 | A * | 10/1998 | Kanda .................... 375/316 |
| 6,347,345 | B1 * | 2/2002 | Cheon .................... 710/20 |
| 7,113,547 | B2 | 9/2006 | Inoue et al. ............. 375/256 |
| 2002/0027347 | A1 * | 3/2002 | Fujita .................... 280/735 |
| 2003/0039313 | A1 * | 2/2003 | Inoue et al. ............. 375/259 |
| 2003/0123590 | A1 | 7/2003 | Saitou et al. ............ 375/354 |

FOREIGN PATENT DOCUMENTS

| EP | 1 168 272 A2 | 1/2002 |
| JP | A 02-274139 | 11/1990 |
| JP | 6-69911 | 3/1994 |
| JP | 07-231316 A | 8/1995 |
| JP | A 07-264250 | 10/1995 |
| JP | 2004-363684 | 12/2002 |
| JP | 2003-69653 | 3/2003 |
| JP | A 2003-199178 | 7/2003 |

* cited by examiner

Primary Examiner—Shuwang Liu
Assistant Examiner—Kabir A Timory
(74) Attorney, Agent, or Firm—Fitzpatrick, Cella, Harper & Scinto

(57) ABSTRACT

The present invention has an object enabling stable data communication hard to perform a malfunction in a simple circuit configuration which can miniaturize a system and does not need any strict accuracy by executing data communication in a connection using two terminals or less. The present invention is featured by being related to a data carrier device including a signal terminal for performing signal input from a data carrier driving device. The data carrier device includes a data communication circuit receiving an input of a pulse having a part having a different duty ratio and a pulse frequency constant on the whole from the data carrier driving device through the signal terminal to generate a data signal.

7 Claims, 15 Drawing Sheets

DATA CARRIER DEVICE, DATA CARRIER DRIVING DEVICE, DATA COMMUNICATION SYSTEM USING DATA CARRIER DRIVING DEVICE AND DATA COMMUNICATION METHOD

BACKGROUND OF THE INVENTION

1. Field of the Invention

The present invention generally relates to data communication, and more particularly to data communication between a data carrier device and a data carrier driving device.

2. Related Background Art

FIG. 15 is a diagram showing the schematic configuration of a conventional data communication system. In the conventional configuration, when a data carrier device 802 and a control device (hereinafter also referred to as a data carrier driving device) 801 perform data communication, four contacts for a power source VIN, ground GND, a clock signal CLK and a data signal DATA are severally provided to connect the data carrier device 802 and the control device 801 with each other.

Moreover, a configuration enabling two-way data communication with two contacts in a system in which a control device and a data carrier device perform data communication with the object of miniaturizing the system is stated in, for example, Japanese Patent Application Laid-Open No. 2003-69653.

Only a data carrier device 900 in the configuration of the control device and the data carrier device which enables the two-way data communication with the two contacts and is stated in Japanese Patent Application Laid-Open No. 2003-69653 is shown in FIG. 16. Here, the operation of the data carrier device 900 shown in FIG. 16 is described using a timing chart, shown in FIG. 17, of the data carrier device 900 of the FIG. 16.

The data carrier device 900 has only two terminals of A terminal A and A terminal B, and performs data communication with the control device with these two terminals. To the terminal A, a pulse voltage VA is input. The pulse voltage VA has a certain fixed frequency and a certain fixed duty ratio. The high levels (hereinafter referred to as H levels) of the voltage amplitudes of the pulse voltage VA include two-step control of V1 and V2, and the low level (hereinafter referred to as an L level) of the pulse voltage VA is ground (GND) potential. Then, to the other residual terminal B, a pulse voltage VB is input. In comparison with the pulse voltage VA, the pulse voltage VB has the same voltage amplitudes as those of the pulse voltage VA, and is in a reversed phase relation with the phase of the pulse voltage VA. In the data carrier device 900, into which these pulse voltages VA and VB are input, a clock generator circuit 901 generates a clock signal CLK which synchronizes with the frequencies of these two pulse voltages VA and VB. Moreover, a VA+VB circuit 902 rectifies these two pulse voltages VA and VB to generate a constant voltage having two-step control V1 and V2 of the H levels of the voltage amplitudes and GND potential of the L level as shown in FIG. 17. An amplitude discriminator circuit 903 detects the difference voltage of the voltage amplitudes of the H level to generate a data signal DATA. The clock signal CLK and the data signal DATA are supplied to an internal circuit 904, the other component of the data carrier device 900, and the data to be communicated is generated.

Moreover, as data communication means from the data carrier device 900, the impedance conversion between the terminal A and the terminal B is performed by shorting the terminal A and the terminal B with each other or the like. And, the control device detects the impedance conversion to receive the data from the data carrier device 900.

However, there are the following problems in the data carrier device mentioned above.

First, because the above-mentioned prior art which is shown in FIG. 15 and is provided with four contacts for the power source VIN, the ground GND, the clock signal CLK and the data signal DATA needs four contacts, the prior art is not suitable for the miniaturization of the system.

Moreover, the data carrier device 900 shown in FIG. 16 operates satisfactory when there is no phase difference at all between the pulse voltage VA input into the terminal A and the pulse voltage VB input into the terminal B. However, because sections in which the two pulse voltages VA and VB together take the L level or together take the H level are produced, sections to which no electric power is supplied to the data carrier device 900 are produced. Hence, there is a possibility of producing a problem of securing the operational stability of the data carrier device 900. In the actual system configuration, there is a possibility of producing the delay of an internal circuit of the control device and a difference of impedance owing to the resistance values and the parasitic capacitance of the wiring from the control device to the terminal A of the data carrier device 900 and the wiring from the control device to the terminal B of the data carrier device 900. Consequently, it is very difficult not to produce any phase differences between the pulse voltage VA input into the terminal A and the pulse voltage VB input into the terminal B.

Moreover, another configuration of the control device and the data carrier device which makes it possible to perform the two-way data communication with two contacts is disclosed in the above-mentioned Japanese Patent Application Laid-Open No. 2003-69653 besides the system shown in FIG. 16. That is, a fixed voltage which has two voltage values composed of the H level of V1 in voltage amplitude and the L level of V2 in voltage amplitude is input into the terminal A of the data carrier device, and the GND potential is input into the terminal B thereof. Then, by detecting the voltage difference between the voltages VA and VB to generate a data signal. Furthermore, there is a method of generating a clock signal in the data carrier device independently of the signal from the control device. However, because the control device and the clock signal of the data carrier device cannot be synchronized with each other by this method, the method has a problem of the complexity of the data communication method.

Moreover, there is the following method as a further method cited in the Japanese Patent Application Laid-Open No. 2003-69653. That is, the duty ratio of a pulse voltage VA input into the terminal A of the data carrier device is fixed to be 50%, and the frequency of the pulse voltage is variably controlled. To the terminal B, a pulse voltage VB having a reversed phase to the phase of the pulse voltage VA is input. By detecting the frequency value, the data signal is generated. Furthermore, there is a method of generating a clock signal synchronizing with the input frequency. However, in this method, the sections in which electric power is not supplied to the data carrier device are produced in the case where a phase difference occurs between the pulse voltages VA and VB. Consequently, the method has a problem of the difficulty of securing the operational stability of the data carrier device.

Moreover, there is the following method as a still further method cited in the Japanese Patent Application Laid-Open No. 2003-69653. That is, a pulse voltage which has the voltage amplitudes of the H level of V and the L level of either of V1 and V2 and a duty ratio of 50% is input into the terminal A of the data carrier device, and the GND potential is input into the terminal B. Then, a data signal is generated by detecting the voltage difference between the voltages V1 and V2 of the L level. Thus, the method is one generating the clock signal synchronized with the input frequency. However, in this method, the voltage difference between the voltages V1 and V2 of the L level becomes a minute value, and the detection means having very high precision becomes necessary. Consequently, the method has a problem such that the system becomes expensive.

Moreover, there is the following as the data communication means from the data carrier device cited in the Japanese Patent Application Laid-Open No. 2003-69653. That is, the impedance conversion between the terminal A and the terminal B is performed by shorting the terminal A and the terminal B with each other, and the impedance conversion is detected on the control device side. Thus, the method is one receiving the data signal from the data carrier device. However, by this method, the short circuit of the power source of the internal circuit is caused, and the method has a further problem of the difficulty of the operational stability of the data carrier device.

As still further prior art, a still further configuration of the control device and the data carrier device enabling the two-way data communication with two contacts, which configuration is stated in the Japanese Patent Application Laid-Open No. 2003-69653, is shown in FIG. 18. FIG. 18 shows only data carrier device 900. Using the timing chart of the data carrier device 900 of FIG. 18 shown in FIG. 19, the operation of the data carrier device 900 shown in FIG. 18 is described.

The data carrier device 900 has only two terminals of an A terminal and a B terminal, and performs the data communication with the control device with these two terminals. A pulse voltage VA having a fixed duty ratio of 50% and a frequency controlled pursuant to the two-step control is applied to the A terminal. There are the frequencies of one having a period of f1 and the other one having a period of f2. A pulse voltage VB having a phase reversed to that of the pulse voltage VA input into the B terminal is input into the B terminal. A frequency discriminator circuit 903 generates a data signal DATA by detecting the frequency value, and generates the data to be communicated by supplying the data signal DATA to the other circuit, the internal circuit 904 to perform the communication with the control device. The clock generator circuit 901 generates the clock signal CLK. A rectifier circuit 905 performs rectification.

However, the data carrier device shown in FIG. 18 has the following problem.

The clock generator circuit 901, which generates the clock signal CLK necessary for the operation of the internal circuit from the pulse voltage VA input into the A terminal, can be realized in a simple circuit configuration in case of generating the clock signal CLK having the frequency synchronized with the frequency of the pulse voltage VA.

However, in the case of the data carrier device 900 shown in FIG. 18, the frequency of the pulse voltage of the pulse voltage VA input into the A terminal is variably controlled for the generation of data signal. Consequently, the frequency of the clock signal CLK necessary for the operation of the internal circuit to be generated varies in response to the data signal DATA. At this time, because the frequency of the clock signal CLK input into the internal circuit 904 differs, the transient characteristic of the internal circuit 904 differs according to each frequency. Consequently, in order to configure the internal circuit 904 stabilized over the input frequency range, there is a problem such that a circuit becomes complicated and a system becomes expensive.

SUMMARY OF THE INVENTION

The present invention was made in view of the above-mentioned problems of the prior art, and relates to a system in which a data carrier driving device (hereinafter also referred to as a control device) and a data carrier device perform data communication. It is an objection of the present invention to provide a data communication technique for enabling two-way data communication with two contacts to make a system miniaturize, and for enabling stable data communication which is difficult to perform a malfunction in a simple circuit configuration which does not need strict accuracy.

A data carrier device according to the present invention includes: a signal terminal for inputting a signal from a data carrier driving device; and a data communication circuit receiving an input of a pulse including a part having a different duty ratio, and a pulse frequency constant on the whole from the data carrier driving device through the signal terminal to generate a data signal based on the pulse.

Moreover, the data carrier device according to the present invention includes a signal terminal to be connected to the data carrier driving device for performing a signal input, and a switch circuit connected to the signal terminal to control whether to flow a constant current or not for outputting the data signal to the data carrier driving device through the signal terminal.

Moreover, the data carrier driving device according to the present invention includes a signal terminal for performing a signal output to the data carrier device, and a voltage amplitude modulation circuit outputting a pulse having a part having a different duty ratio and a pulse frequency constant on the whole to the data carrier device through the signal terminal.

Moreover, the data carrier driving device according to the present invention includes a signal terminal connected to the data carrier device for performing a signal input, and a current detector circuit generating a data signal according to a current flowing through the signal terminal.

Moreover, a data communication system according to the present invention is a data communication system in which a data carrier driving device and a data carrier device a connected to each other at least through a signal terminal, wherein the data carrier driving device includes a voltage amplitude modulation circuit outputting a pulse to the data carrier device through the signal terminal according to data, the pulse having a part having a different duty ratio and a pulse frequency constant on the whole, and the data carrier device includes a data communication circuit receiving an input of the pulse having the part having the different duty ratio and the pulse frequency constant on the whole from the data carrier driving device through the signal terminal to generate a data signal based on the pulse.

Moreover, the data communication system according to the present invention is a data communication system in which the data carrier device and the data carrier driving device are connected to each other at least through a signal terminal, wherein the data carrier device includes a switch circuit connected to the signal terminal to control whether to flow a constant current for outputting a data signal to the data carrier deriving device though the signal terminal, and the data carrier driving device include a current detector circuit generating the data signal according to the current flowing through the signal terminal.

Moreover, the data communication method of the present invention is a data communication method between a data carrier driving device and a data carrier device connected to each other at leas through a signal terminal including an input step of the data carrier device inputting a pulse having a part having a different duty ratio and a pulse frequency constant on the whole from the data carrier driving device through the signal terminal, and a data generation step of the data carrier device generating a data signal based on the pulse.

A data carrier device according to the present invention includes a first and a second terminals for performing two-terminal input of pulse signals having phases reverse to each other from the outside, and a data communication circuit inputting the pulse signals each having a part having a different duty ratio and a frequency constant on the whole from the outside through the first and the second terminals to generate a data signal based on the input pulses.

Moreover, a data communication method of the present invention is a data communication method of a data carrier device performing a two-terminal input of pulse signals each having a phase reverse to each other from the outside through a first and a second terminals, the method including a data generation step of inputting a pulse signal having a part having a different duty ratio and a frequency constant on the whole from the outside through the first and the second terminals to generate a data signal based on the input pulse.

Consequently, because the present invention can perform data communication with a two-terminal connection or less, the present invention can miniaturize the system. Furthermore, the present invention enables stable data communication hard to perform a malfunction with a simple circuit configuration which does not need strict accuracy.

DETAILED DESCRIPTION OF THE PREFERRED EMBODIMENTS

Next, the preferred embodiments of the present inventing in detail with reference to the attached drawings.

First Embodiment

Figure 1:
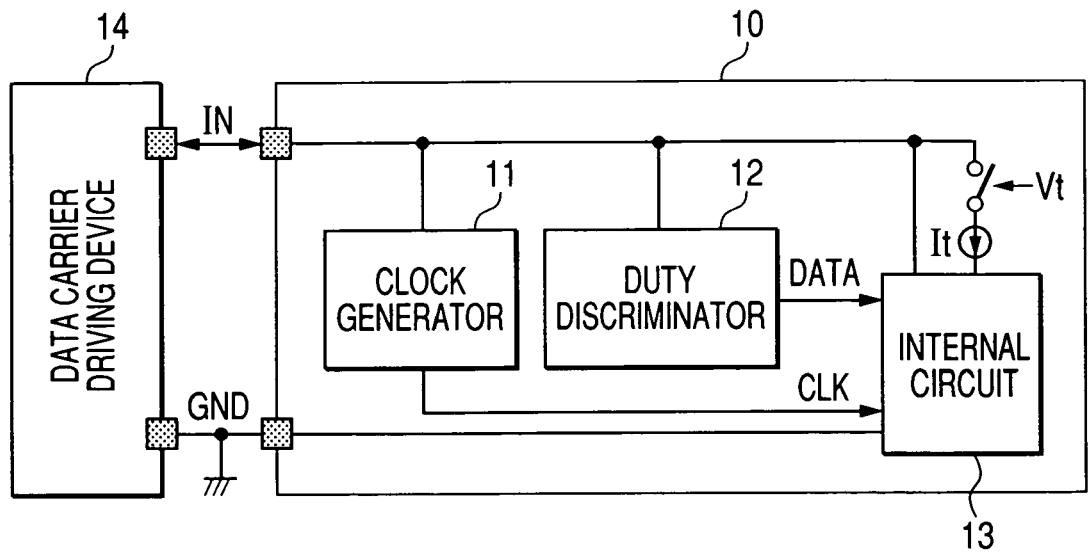
FIG. 1 is a diagram showing the configuration of a data carrier device according to a first embodiment of the present invention and a driving device of the data carrier device.

FIG. 1 is a block diagram showing a data communication system including a data carrier device 10 according to a first embodiment of the present invention, and a driving device 14 of the data carrier device 10. In FIG. 1, a reference numeral 10 denotes a data carrier device which performs data communication with the control device (data carrier driving device) 14 with two contacts. The control device 14 has two terminals of an IN terminal (signal terminal) and a GND terminal (reference voltage terminal). Moreover, a reference numeral 14 denotes a data carrier driving device as the control device, the data carrier driving device 14 and the data carrier device 10 are connected with each other only with two contacts, the IN terminal and the GND terminal. The data carrier driving device 14 and the data carrier device 10 perform data communication through the two contacts. The data carrier device 10 generates the power source of all the circuits constituting the data carrier device 10 from a signal input from the data carrier driving device 14 into between the IN terminal and the GND terminal of the data carrier device 10. Moreover, the data carrier device 10 is composed of a clock generator circuit 11 generating a clock signal CLK necessary for data communication from a signal input from the IN terminal, a duty discriminator circuit 12 generating data signal DATA necessary for the data communication from the signal input from the IN terminal, and an internal circuit 13 receiving the input of the clock signal CLK and the data signal DATA to perform data communication with the data carrier driving device 14 based on these signals. The internal circuit 13 includes means for drawing or outputting a constant current It. The on-off control of the constant current It is performed by a controlling signal Vt. The data carrier driving device 14 detects the existence of the constant current It to make it the data signal transmitted from the data carrier device 10.

Next, the operation of the system shown in FIG. 1 is described with reference to the timing chart of FIG. 2. A pulse voltage is input from the data carrier driving device 14 into the IN terminal of the data carrier device 10. The pulse voltage has voltage amplitudes of an H level of V1 and an L level of V2. The frequency of the pulse voltage is constant. The periods (duties) of the H level of the pulses are duty 1 and duty 2.

The pulses of duty 1 and duty 2 are different from each other in their duty ratios. The GND terminal is connected to the GND potential as a reference voltage. At this time, the V2, which is the L level of the pulse voltage, is sufficiently larger than the GND potential. The clock generator circuit 11 of FIG. 1 generates the clock signal CLK. For example, the rise of the pulse voltage and the rise of the clock signal CLK are synchronized with each other. The frequency of the clock signal CLK is the same frequency as the frequency of the pulse voltage input into the IN terminal.

Moreover, the duty discriminator circuit 12 of FIG. 1 discriminates whether the H level period (duty) of the pulse voltage input into the IN terminal of the data carrier device 10 is duty 1 or whether it is duty 2 (discriminates the duty ratio thereof), and generates a signal corresponding to the duty ratio as the data signal DATA. When the voltage of the IN terminal is the H level at a trailing edge of the clock signal CLK, the data signal DATA keeps to output the H level, and when the voltage of the IN terminal is the L level at a trailing edge of the clock signal CLK, the data signal DATA keeps to output the L level. By inputting the clock signal CLK and the data signal DATA generated in such a way into the internal circuit 13 of the data carrier device 10 of FIG. 1, the data communication with the control device 14 is performed.

Here, the switch circuit, which pulls or output the constant current It as the data communication means with the data carrier driving device 14, exists in the internal circuit 13. The constant current It receives the on-off control thereof by the controlling signal Vt of the switch circuit. The data carrier driving device 14 detects the existence of the constant current It by, for example, inserting a resistance between a voltage supply terminal of the data carrier driving device 14 and the IN terminal of the data carrier device 10 to detect the existence of the constant current It as the potential difference generated over the resistance produced by the existence of the constant current It. The potential difference is received by the data carrier driving device 14 as a data signal from the data carrier device 10.

Figure 2:
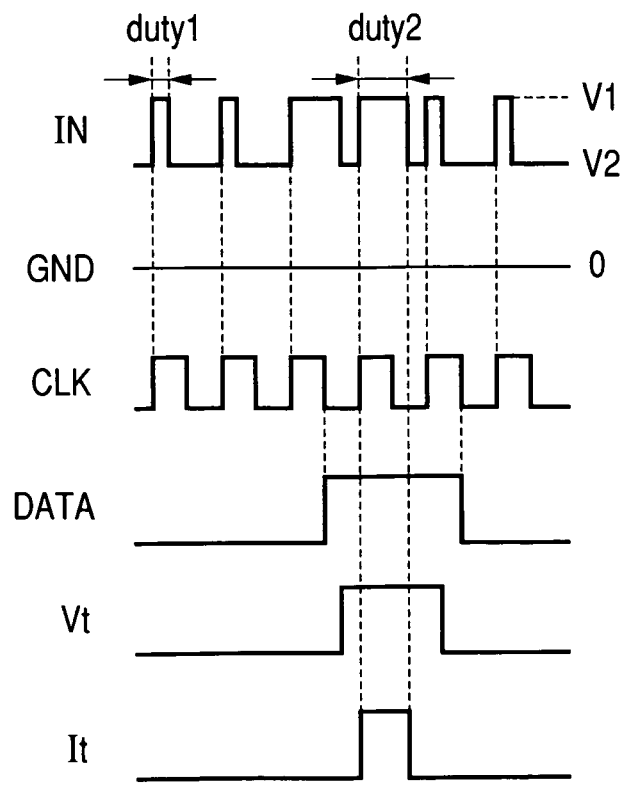
FIG. 2 is a timing chart showing the operation of the configuration of FIG. 1.

At this time, it is effective to limit the period of drawing or outputting the constant current It from the data carrier device 10 to within the H level period of the voltage amplitude of the pulse voltage input into the IN terminal of the data carrier device 10 as shown in the timing chart of FIG. 2. For example, in case of drawing the constant current It from the data carrier device 10, as described above, when the resistance is inserted between the IN terminal and the voltage supply terminal as data signal receiving means from the data carrier device 10 in the data carrier driving device 14, a voltage drop owing to the resistance and the constant current is produced. When the constant current It is drawn during the L level period of the voltage amplitude of the pulse voltage input into the IN terminal of the data carrier device 10, the effective voltage between the IN terminal and the GND terminal falls by the influence of the voltage drop by the inserted resistance at the time of drawing the constant current It. Because all the circuits constituting the data carrier device 10 generate the power sources of the circuits based on the voltage between the IN terminal and the GND terminal, the power source voltage of the internal circuit of the data carrier device 10 may fall, and the falling may become the hindrance of the operational stability. Moreover, when the method of detecting the voltage value of the resistance connected to IN terminal as the data signal receiving means from the data carrier device 10 is used, it is considerable to enlarge the resistance value connected to the IN terminal as a method of raising the detection accuracy of a certain constant current It. The enlargement of the resistance value becomes effective to enlarge the voltage value generated over the resistance. However, in that case, the voltage drop value by the resistance at the time of drawing the constant current It also becomes large, and the effective voltage between the IN terminal and the GND terminal falls greatly, which may become the hindrance of the operational stability of the internal circuit of the data carrier device 10. Accordingly, it becomes effective to limit the drawing period of the constant current It into the H level period of the voltage amplitude of the pulse voltage input into the IN terminal, during which the restriction of the operation voltage condition is loose.

The system configuration of FIG. 1 is not the method of applying two pulse voltages which are mutually in a reverse phase relation, which method has been performed to the conventional data carrier device performing data communication only with two terminals. Consequently, no sections in which electric power is not supplied to the data carrier device, which sections are produced when phase difference exists between applied two pulse voltages, are produced. Consequently, it is possible to stably supply a power source necessary for making the internal circuit operate, and it becomes possible to prevent the malfunction of the internal circuit which may be produced in at an instantaneous lowered time of the power source and the like.

Moreover, the frequency of the clock signal CLK generated by the clock generator circuit 11 of the data carrier device 10 can be synchronized with the frequency of the pulse voltage input into the IN terminal of the data carrier device 10 from the data carrier driving device 14. Consequently, even when the set value of the pulse voltage input from the data carrier driving device 14 into the IN terminal of the data carrier device is changed or varied, the clock signal CLK generated by the clock generator circuit 11 of the data carrier device 10 synchronizes with the frequency. Consequently, it is unnecessary to perform strict timing design and the like, and it becomes possible to simplify the whole system.

Moreover, generally, the data carrier driving device 14 is frequently composed of a general purpose microcomputer, and the frequency of the clock signal for driving the microcomputer is a very high frequency of the order of MHz or more. The clock signal is sufficiently higher frequency as compared with the frequency of the pulse voltage input from the data carrier driving device 14 into the IN terminal of the data carrier device 10. Accordingly, using the clock signal for driving the microcomputer would simplify the control of the H level periods (duties) of the pulse voltage input from the data carrier driving device 14 into the data carrier device 10. Also as to this point, the performance of the strict timing design and the like is not necessary, and it makes it possible to simplify the system design of the whole.

Moreover, the system configuration of FIG. 1 includes a circuit configuration of drawing or outputting the constant current It as the data communication means with the data carrier driving device 14, and does not employ the method of shorting the power sources of the circuits constituting the data carrier device 10 with the object of performing impedance conversion. Consequently, because the potential V2 is applied as the pulse voltage input into the IN terminal even at the lowest, stable circuit operation which is difficult to cause any malfunctions owing to low noises is enabled.

The period of drawing the constant current It is limited to within the H level periods of the voltage amplitude of the pulse voltage input into the IN terminal of the data carrier device 10. Thereby, the stable power sources can be supplied to the internal circuits of the data carrier device 10 together with improving the detection accuracy of the reception of data signals in the data carrier driving device 14 from the data carrier device 10. Consequently, it becomes possible to prevent the malfunctions of the internal circuits which may be produced at an instantaneous lowered time of the power sources and the like.

Second Embodiment

Figure 3:
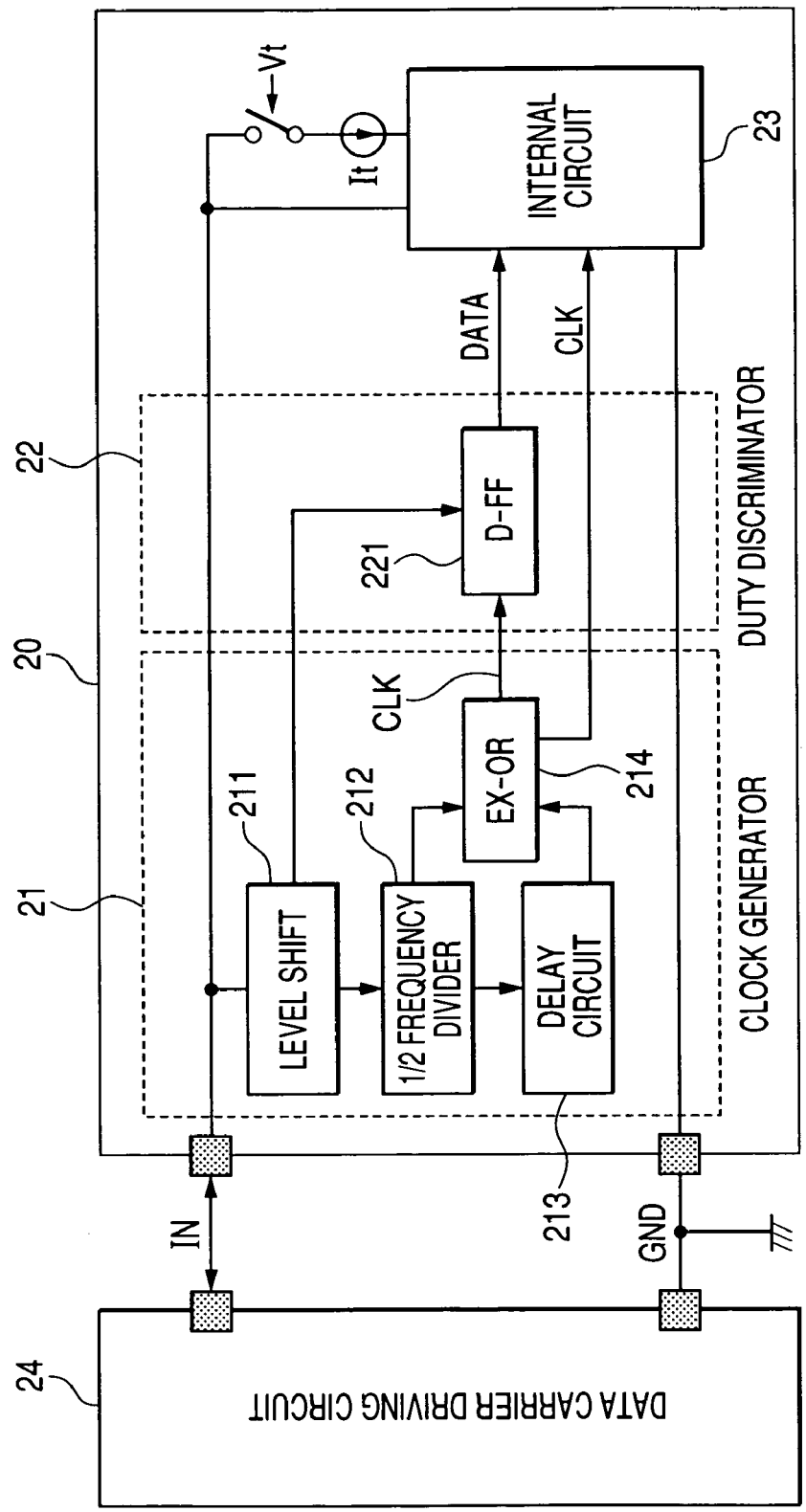
FIG. 3 is a diagram showing the configuration of a data carrier device according to a second embodiment of the present invention and a driving device of the data carrier device.

FIG. 3 is a block diagram showing a data communication system including a data carrier device 20 according to a second embodiment of the present invention, and a driving device 24 of the data carrier device 20. The present embodiment shows the first embodiment still more concretely. In FIG. 3, the reference numeral 20 denotes the data carrier device performing data communication with the control device (data carrier driving device) through two contacts, and the data carrier device 20 includes two terminals of an IN terminal and a GND terminal. Moreover, the reference numeral 24 denotes the data carrier driving device as the control device. The data carrier driving device 24 and the data carrier device 20 are connected through only the two contacts of the IN terminal as a signal terminal and the GND terminal as the reference voltage terminal, and perform data communication through the two contacts. Moreover, the data carrier device 20 generates the power sources of all the circuits constituting the data carrier device 20 from a signal input from the data carrier driving device 24 into between the IN terminal and the GND terminal of the data carrier device 20. Moreover, the data carrier device 20 is composed of a clock generator circuit 21, a duty discriminator circuit 22 and an internal circuit 23.

The clock generator circuit 21 generates a clock signal CLK necessary for data communication from a signal input from the IN terminal. The duty discriminator circuit 22 generates data signal DATA necessary for the data communication from the signal input from the IN terminal. The internal circuit 23 receives the input of the clock signal and the data signal DATA, and performs the data communication with the data carrier driving device 24 based on the input signals.

The internal circuit 23 includes the means for drawing or outputting the constant current It. The on-off control of the constant current It is performed by a controlling signal Vt. The data carrier driving device 24 detects the existence of the constant current It to make it the data signal transmitted from the data carrier device 20.

Hereupon, the clock generator circuit 21 is composed of a level shift circuit 211, a ½ frequency divider circuit 212, a delay circuit 213 and an EX-OR (exclusive or) arithmetic circuit 214 as an example of a concrete circuit.

The level shift circuit 211 converts the voltage amplitude of the pulse voltage input from the data carrier driving device 24 into the IN terminal of the data carrier device 20. The ½ frequency divider circuit 212 performs the ½ frequency division of the signal from the level shift circuit 211. The delay circuit 213 delays the signal from the ½ frequency divider circuit 212. The EX-OR (exclusive or) arithmetic circuit 214 receives the input of the two signals from the ½ frequency divider circuit 212 and the delay circuit 213, and outputs an EX-OR (exclusive or) operation result as the clock signal CLK for making the internal circuit 23 operate.

Moreover, the duty discriminator circuit 22 is composed of a D flip-flop circuit 221 as an example of a concrete circuit.

The D flip-flop circuit 221 receives a signal from the EX-OR (exclusive or) arithmetic circuit 214 as the clock signal CLK, and operates in synchronization with the clock signal CLK using a signal from the level shift circuit 211 as an input signal. Consequently, the D flip-flop circuit 221 judges whether the signal from the level shift circuit 211 has the H level or the L level, and outputs an output signal corresponding to the signal level from the level shift circuit 211 as the data signal DATA for performing the data communication with the data carrier driving device 24.

Figure 4:
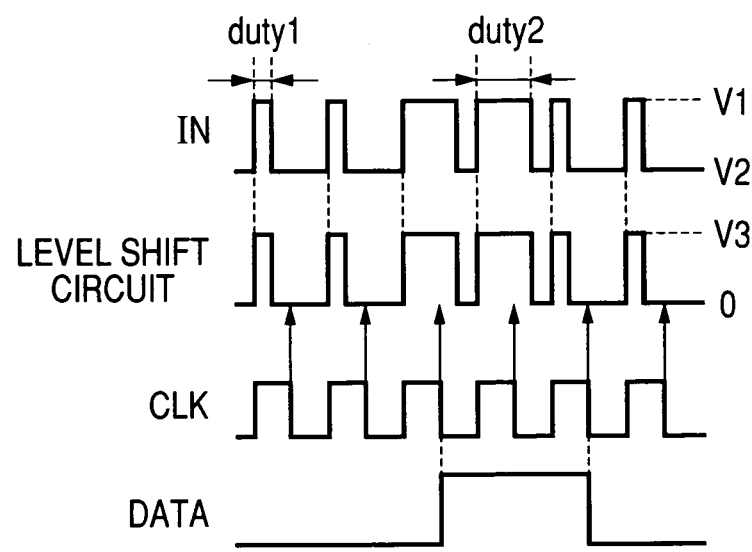
FIG. 4 is a timing chart showing the operation of the configuration of FIG. 3.

Next, the operation of the system shown in FIG. 3 is described with reference to the timing chart of FIG. 4. A pulse voltage is input into the IN terminal. The pulse voltage has voltage amplitudes of an H level of V1 and an L level of V2. The frequency of the pulse voltage is constant. The periods (duties) of the H level of the pulses are duty 1 and duty 2. At this time, the V2, which is the L level of the pulse voltage, is sufficiently larger than the GND potential as the reference voltage. The voltage amplitude conversion of the pulse voltage input into the IN terminal is performed by the level shift circuit 211, for example, so that the H level may be converted to V3 and the L level may be converted to the GND potential.

Figure 5:
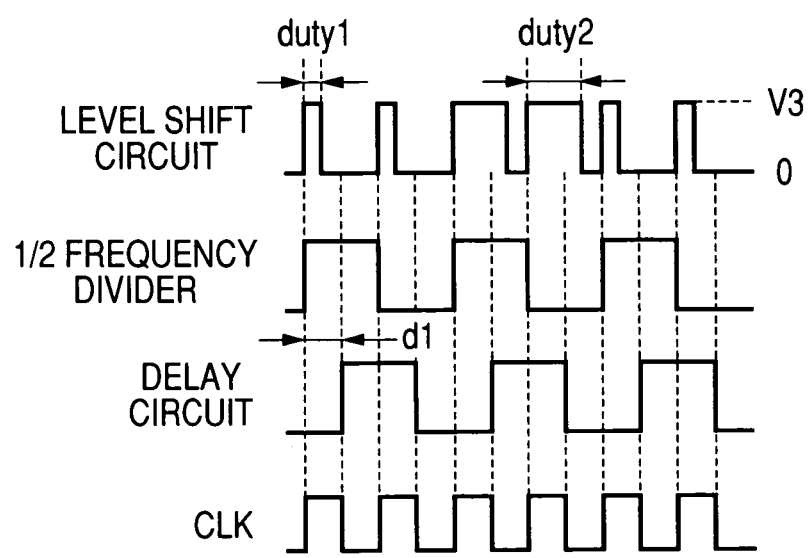
FIG. 5 is a timing chart showing the operation of a clock generator circuit of FIG. 3.

Here, the operation of the clock generator circuit 11 is described using the timing chart of FIG. 5. The ½ frequency division of the output signal from the level shift circuit 211 is performed by the ½ frequency divider circuit 212. The H level and the L level of an output signal from the ½ frequency divider circuit 212 is changed from each other in synchronization with a rise of the output signal from the level shift circuit 211. Consequently, the frequency of the output signal from the ½ frequency divider circuit 212 is set pursuant to only the frequency of the output signal from the level shift circuit 211.

Next, the delay circuit 213 receives the input of the output signal from the ½ frequency divider circuit 212, and delays the received signal by a certain delay time d1 to output the delayed signal. The EX-OR circuit 214 receives the input of the output signal from the ½ frequency divider circuit 212 and the output signal from the delay circuit 213, and performs the EX-OR operation of these received signals. Consequently, the EX-OR circuit 214 can generates an output signal having a frequency according with the frequency of the output signal from the level shift circuit 211 and synchronizing with the timing of a rise of the output signal from the level shift circuit 211. For example, the delay time d1 is set to be ½ of the period of the pulse voltage input from the data carrier driving device 24 into the IN terminal of the data carrier device 20. In this case, the EX-OR circuit 214 can generates the clock signal CLK having the same frequency as that of the pulse voltage input into the IN terminal and a duty ratio of 50%.

Next, the output signal from the EX-OR circuit 214 and the signal from the level shift circuit 211 are input into the D flip-flop circuit 221, which is the duty discriminator circuit 22, as the clock signal CLK and the input signal, respectively. Here, as shown in the timing chart of FIG. 4, the trailing edges of the clock signal CLK are used as the clock signal for making the D flip-flop circuit 221 operate. In this case, the output signal of the D flip-flop circuit 221 is switched correspondingly to which level of the H level and the L level the signal from the level shift circuit 211 takes in synchronization with the trailing edge of the clock signal CLK. For example, when the signal from the level shift circuit 211 takes the H level, the output signal of the D flip-flop circuit 221 takes the H level. When the signal from the level shift circuit 211 takes the L level, the output signal of the D flip-flop circuit 221 takes the L level. It is the duty ratio of the pulse voltage input from the data carrier driving device 24 into the IN terminal of the data carrier device 20 that determines the signal level of the signal from the level shift circuit 211 to be the H level or the L level at the trailing edges of the clock signal CLK. That is, the switching of the output signal of the D flip-flop circuit 221 is in response to the switching of the duty ratio of the pulse voltage input into the IN terminal. It becomes possible to control the duty ratio of the pulse voltage input into the IN terminal as the data signal from the data carrier driving device 24, and to discriminates the duty ratio by the D flip-flop circuit 221 to use the output signal as the data reception signal from the data carrier driving device 24.

By inputting the thus generated clock signal CLK, the output signal from the clock generator circuit 21, and the data signal DATA, the output signal from the duty discriminator circuit 22, into the internal circuit 23 of FIG. 3, the data communication with the data carrier driving device 24 can be performed. Here, a circuit which draws or outputs the constant current It as the data communication means with the data carrier driving device 14, exists in the internal circuit 23. The data carrier driving device 24 detects the current from the data carrier device 20 to receive the current as the data signal from the data carrier device 20.

As a concrete detection method of the current from the data carrier device 20, for example, the current is detected as the potential difference over a resistance inserted between the voltage supply terminal of the data carrier driving device 24 and the IN terminal of the data carrier device 20.

Figure 6:
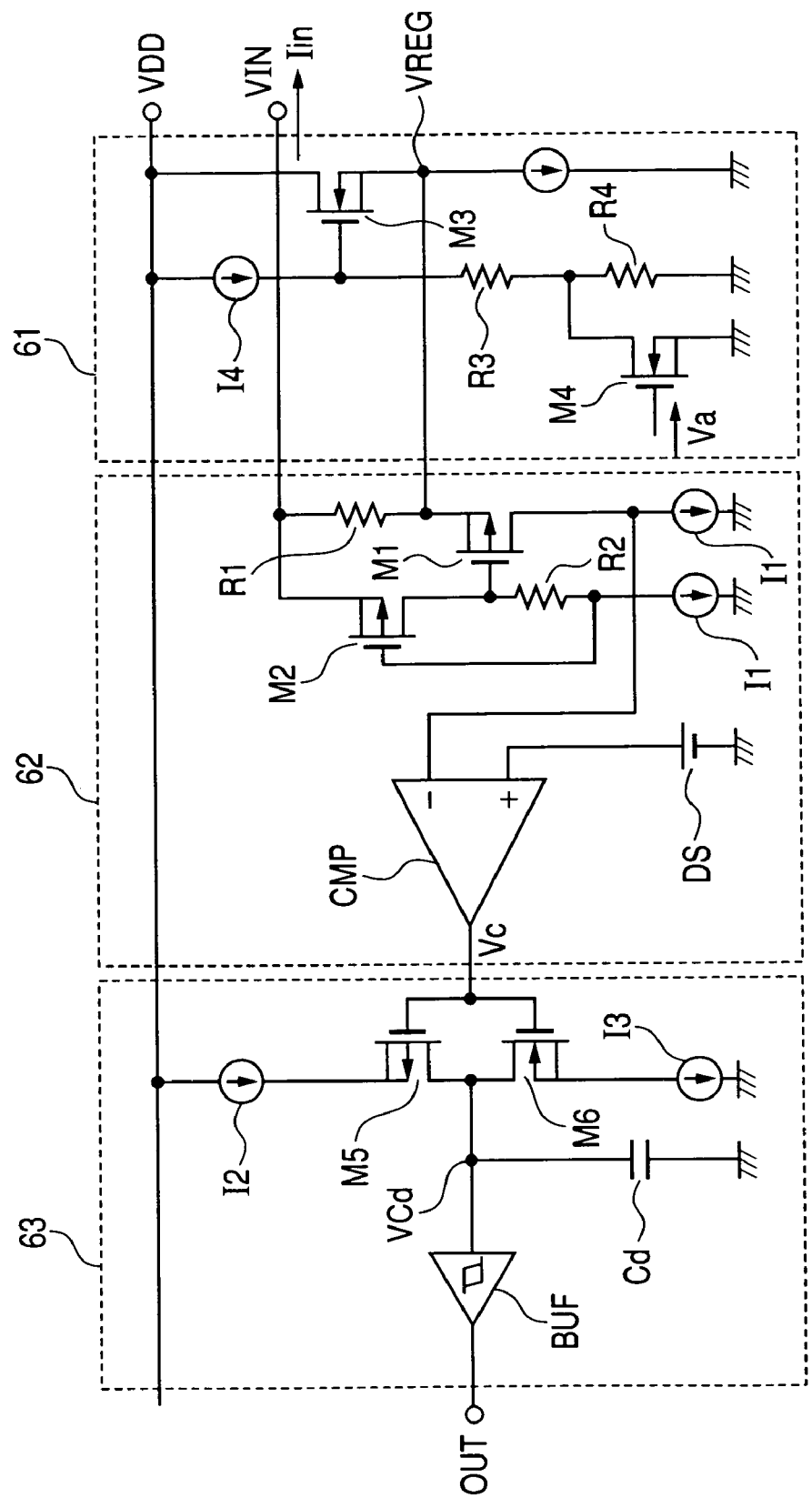
FIG. 6 is a diagram showing an example of the circuit configuration of the data carrier device and its driving device of FIG. 3.

Here, an example of the circuit configuration of the data carrier deriving device 24 is shown in FIG. 6. The data carrier driving device shown in FIG. 6 is composed of a voltage amplitude modulation circuit 61, a current detector circuit 62 and a non-responsive time setting circuit 63.

The voltage amplitude modulation circuit 61 includes a part in which a duty ratio differs according to data, and as the whole outputs a pulse having a constant pulse frequency to the data carrier device through the IN terminal.

The current detector circuit 62 generates a data signal according to the current flowing through the IN terminal. The non-responsive time setting circuit 63 sets a non-responsive time being non-responsive to the current instantaneously flowing into the current detector circuit 62.

The voltage amplitude modulation circuit 61 equipped with a VDD terminal as the power source of the circuit generates a VREG voltage being a voltage used as the basis to be applied to the data carrier device 20 at a VREG terminal. The current detector circuit 62 includes a resistor R1 for detecting the current from the data carrier device 20. The current detector circuit 62 is connected from the VREG terminal to the IN terminal of the data carrier device 20 through the resistor R1. Then, the current detector circuit 62 supplies the power source of a voltage VIN to the data carrier device 20, and applies a signal to be a basis of the clock signal and the data signal to the data carrier device 20. The voltage of the IN terminal is VIN. Then, the current detector circuit 62 detects the current It being the data transmission signal from the data carrier device 20. The detection result is output as the data reception signal from the data carrier device 20 to an OUT terminal through the non-responsive time setting circuit 63 for distinguishing between the current It, which is the data transmission signal, and a current at the time of a usual operation other that the data transmission of the data carrier device 20.

From now on, the detailed operations of the respective circuits of the data carrier driving device shown in FIG. 6 are described. The voltage amplitude modulation circuit 61 is equipped with the VDD terminal as the power source of the circuit, and defines the gate terminal voltage of an N channel MOS field effect transistor (NMOS transistor) M3 by a constant current I4 and a resistors R3 and R4. Then, the voltage amplitude modulation circuit 61 takes a source follower circuit configuration of supplying a voltage obtained by subtracting a gate-source voltage Vgs3 of the NMOS transistor M3 from the gate terminal voltage to the VREG terminal. By controlling an external voltage Va, the NMOS transistor M4 receives its on-off control, and it is possible to control the VREG voltage being the VREG terminal voltage. Here, the VREG voltage when the NMOS transistor M4 is turned off becomes as follows.

$$VREG \text{ voltage} = (R3+R4) \times I4 \times Vgs3$$

Moreover, the VREG voltage when the NMOS transistor M4 is turned on becomes as follows.

$$VREG \text{ voltage} = R3 \times I4 - Vgs3$$

Consequently, it is supposed that "the VREG voltage when the NMOS transistor M4 is turned on"<"the VREG voltage when the NMOS transistor M4 is turned on." By setting the resistors R3 and R4 and the constant current I4 as appropriated values severally, and by performing the on-off control of the NMOS transistor M4 in response to the clock signal and the data signal to be transmitted to the data carrier device 20, it is possible to generate the pulse voltage applied to the IN terminal of the data carrier device 20. The pulse voltage has two values of voltage amplitudes of the H level being V1 and the L level being V2, and the frequency of the pulse voltage is constant. Furthermore, the H level periods (duties) of the pulse have two values of the duty 1 and the duty 2.

Next, the operation of the current detector circuit 62 is described. The current detector circuit 62 is configured as follows. In the current detector 62, the resistor R1 for detecting the current from the data carrier device 20 is connected between the VREG terminal, being the voltage output terminal of the voltage amplitude modulation circuit 61, and the IN terminal of the data carrier device 20. A source terminal of a P channel MOS field effect transistor (PMOS transistor) M1 is connected to the VREG terminal. A constant current source of a current I1 and an input terminal on the negative side of a comparator CMP are connected to the drain terminal of the PMOS transistor M1. The source terminal of a PMOS transistor M2 is connected to the IN terminal. The gate terminal of the PMOS transistor M1 and a resistor R2 are connected to the drain terminal of the PMOS transistor M2. The gate terminal of the PMOS transistor M2 and the constant current source of the current I1 are connected to the residual other terminal of the resistor R2. A voltage source DS as a reference voltage of the comparator CMP is connected to the input terminal on the positive side of the comparator CMP.

Here, when it is supposed that the gate terminal voltage of the PMOS transistor M1 is denoted as Vg1, the gate terminal voltage Vg1 becomes as follows.

$$Vg1 = VIN \times Vgs2 + R2 \times I1$$

where Vgs2 denotes a gate-source voltage of the PMOS transistor M2. Moreover, when a current value flowing into the IN terminal is denoted Iin, the voltage VIN at the IN terminal is as follows.

$$VIN = VREG \times R1 \times Iin$$

At this time, because the source voltage of the PMOS transistor M1 is a VREG voltage, the gate-source voltage Vgs1 of the PMOS transistor M1 becomes as follows.

$$\begin{aligned} Vgs1 &= VREG - (VIN - Vgs2 + R2 \times I1) \\ &= VREG - (VREG - R1 \times Iin) + Vgs2 - R2 \times I1 \\ &= R1 \times Iin + Vgs2 - R2 \times I1 \end{aligned}$$

Here, when it is supposed that the current value Iin flowing into the IN terminal is sufficiently small in the current at the time of a normal operation other than the data transmission of the data carrier device 20, the following formula is true.

$$Vgs1 \cong Vgs2 \times R2 \times I1$$

Here, because the constant current source having the same current value I1 as that of the PMOS transistor M2 is connected to the PMOS transistor M1, the gate-source voltage necessary for turning on the PMOS transistor M1 becomes almost equal to Vgs2. Consequently, in the current at the time of normal operation other than the time of transmission of data of the data carrier device 20, Vgs1≦Vgs2. Then, the PMOS transistor M1 cannot be turned on. The input terminal voltage on the negative side of the comparator CMP becomes the L level, which is lower than the reference voltage of the comparator CMP connected to the input terminal on the negative side of the comparator CMP. Consequently, the output terminal voltage Vc of the comparator CMP becomes the H level.

Here, when the current It, which is the data transmission signal from the data carrier device 20, flows, the current value Iin flowing out to the IN terminal becomes a sufficiently large value, and becomes R1×Iin≧R2×I1. Consequently, Vgs1≧Vgs2, and then the PMOS transistor M1 is turned on. Consequently, the input terminal voltage on the negative side of the comparator CMP becomes H level, and because it is higher than the reference voltage of the comparator CMP connected to the input terminal on the positive side of the comparator CMP, the output terminal voltage Vc of the comparator CMP becomes L level.

The resistors R1 and R2 and the constant current I1 are set to have suitable values so that the output off the comparator CMP may be switched at the time when the current It, which is the data transmission signal from the data carrier device 20, flows. Thereby, a threshold value for detecting the current It, which is the data transmission signal from the data carrier device 20, can be set. The PMOS transistors, the resistances and the constant current sources are used for the detection circuit. When the circuit configuration is produced using a general semiconductor process, there is almost no relative variations in the parameters of the elements constituting the circuit such as the gate-source voltages of the PMOS transistors and the resistance values. Moreover, because the circuit configuration in which the dispersion of the absolute values from the set values of the respective elements and the temperature characteristics mutually cancel to offset each other when the dispersion and the temperature characteristics are large is employed, it can be said that the circuit configuration is very strong to external change factors.

Next, the operation of the non-responsive time setting circuit 63 is described. In the internal circuit of the data carrier device 20, when a circuit configuration including many logic circuits is employed, the logic circuits all together operates at the same time at the time of a change of a clock, and a large current instantaneously flows. In many cases, the current value becomes large than the current It, which is the data transmission signal from the data carrier device 20. Consequently, when a non-responsive time is not set, the output of the current detector circuit 62 is changed by the instantaneous large current, and it becomes difficult to detect the current It, which is the data transmission signal from the data carrier device 20.

Figure 7:
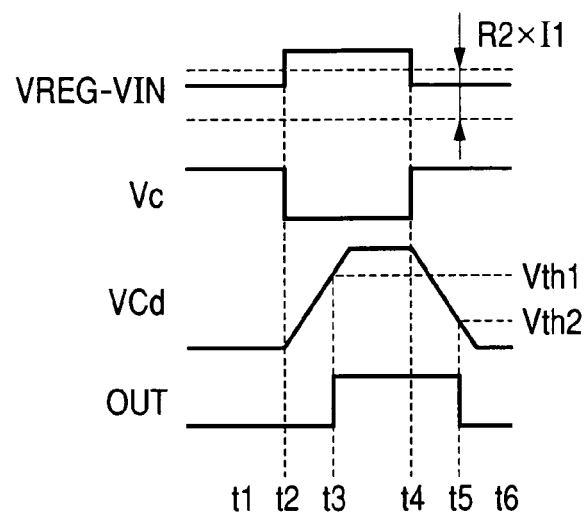
FIG. 7 is a timing chart showing the operation of the example of the circuit configuration of the data carrier device and its driving device.

Here, the operation of the non-responsive time setting circuit 63 is described using the timing chart shown in FIG. 7. In the circuit configuration, a non-responsive time is set by the capacitance value of a non-responsive time setting capacitor Cd, and a charging current I2 and a discharging current I3 to the capacitor Cd. An inverter circuit composed of a PMOS transistor M5 and an NMOS transistor M6 performs the changes of the charge and discharge currents of the capacitor Cd according to an output voltage Vc of the current detector circuit 62. The non-responsive time setting circuit 63 is configured so that a voltage VCd of the non-responsive time setting capacitor Cd is input into a Schmidt trigger buffer BUF, and that the output of the Schmidt trigger buffer BUF is switched according to the voltage VCd to be output to an OUT terminal.

At a time t1 when the current It, which is the data transmission signal from the data carrier device 20, is not flowing, because the output voltage Vc of the current detector circuit 62 is equal to the H level, the NMOS transistor M6 has been turned on. Consequently, the non-responsive time setting capacitor Cd has discharged to the GND potential level. At time t2, the current It, which is the data transmission signal from the data carrier device 20, flows, and when the voltage generated over the resistor R1 of the current detector circuit 62 becomes larger than a voltage of R2×I1, the output of the comparator CMP is switched. Consequently, the output voltage Vc of the current detector circuit 62 becomes the L level. Consequently, the PMOS transistor M5 is turned on, and the non-responsive time setting capacitor Cd is charged by the constant current I2, so that the voltage VCd of the capacitor Cd rises. Here, at a time t3, when the voltage VCd exceeds a first threshold value Vth1 of the Schmidt trigger buffer BUF, the OUT terminal, which is the output of the Schmidt trigger buffer BUF, is turned from the L level to the H level. Next, at a time t4, when the current It, which is the data transmission signal from the data carrier device 20, comes not to flow, the voltage generated over the resistor R1 of the current detector circuit 62 becomes smaller than the voltage of R2×I1. Consequently, the NMOS transistor M6 is turned on, and the non-responsive time setting capacitor Cd discharges through the constant current I3, and the voltage VCd of the capacitor Cd falls. Here, at a time t5, when the voltage VCd becomes lower than a second threshold value Vth2 of the Schmidt trigger buffer BUF, the OUT terminal, which is the output of the Schmidt trigger buffer BUF, is switched from the H level to the L level.

Here, in the case where the circuits constituting the data carrier device 20 includes a circuit configuration including many logic circuits, the non-responsive times (t3-t2) and (t5-t4), which are set for the switching of the output voltage Vc of the current detector circuit 62, are set to be sufficiently large. In concrete terms, by setting the non-responsive times to be sufficiently large to the time during which the a large current instantaneously flows because the logic circuits of the data carrier device 20 all together operate, it becomes possible to discriminate the current It, which is the data transmission signal from the data carrier device 20, stably.

In an example of the circuit configuration shown in FIG. 6, although the current detector circuit 62 and the non-responsive time setting circuit 63 are separated from each other, even if the non-responsive time is set in the current detection portion of the current detector circuit 62, the same effect can be given. Moreover, as long as a circuit has the circuit configuration with the same effect, it is not necessary to be the circuit configuration especially shown in FIG. 6.

Here, in the second embodiment, because almost all the circuits are composed of the logic circuits, the circuit constants are not governed in dependence on strict analog potential. Consequently, even in the power source voltage having pulse amplitudes which is inputted into the IN terminal and many noise components, sufficiently stable circuit operations become possible. Moreover, even in a circuit configuration in which a lot of noise components generated at the time when many internal circuits operate in synchronization with a clock signal exists, the sufficiently stable circuit operations become possible.

Moreover, in the duty discriminator circuit 22, the delay time of the delay circuit 213 determining this timing is required only to be able to discriminate the duty ratio of the pulse voltage input from the data carrier driving device 24 into the IN terminal of the data carrier device 20. Consequently, as long as the duty ratios of the pulse voltage input into the IN terminal differ from each other sufficiently large, the setting of strict delay times is not necessary, and the delay circuit can be realized by a circuit having a simple configuration.

Moreover, in the data carrier driving device 24, when the circuit configuration is produced using a general semiconductor process, the circuit configuration is not influences by external primary factors such as relative dispersion, the dispersion of absolute values, and temperature characteristics of the components. Moreover, it becomes possible to realize the non-responsive time setting circuit 63 and the current detector circuit 62 which do not incorrectly detect the current at the time of the operation of the internal circuits of the data carrier device 20 and the current It, which is the data transmission signal from the carrier device 20, but can stably perform discrimination.

Incidentally, in the first embodiment and the second embodiment, the kinds of the H level periods (duties) of the pulse voltage input into the IN terminal of the data carrier device from the data carrier driving device may be a multiple value of three or more values. If it is two values, and if these two H level periods (duties) can be discriminated easily, the two H level periods (duties) are not necessarily to be 100% when they are totaled.

Moreover, in descriptions of the first embodiment and the second embodiment, although the configuration is one composed of the two terminals of the IN terminal as the signal terminal and the GND terminal as the reference voltage terminal, the reference voltage terminal is not necessarily to be the GND potential. For example, a configuration in which a certain constant voltage is input from the data carrier driving device into one terminal of the data carrier device and a signal is input from the data carrier driving device into the residual other terminal of the data carrier device may be adopted. Alternatively, a configuration in which the reference voltage of the data carrier device is input from something other than the data carrier driving device and a signal is input from the data carrier driving device into the residual other terminal of the data carrier device may be adopted. Alternatively, a configuration in which the reference voltage terminal of the data carrier device is not a constant voltage and both the signals input from the data carrier driving device into the two terminals of the data carrier device severally have a frequency and a duty signal may be adopted. That is, as long as the data communication between the data carrier driving device and the data carrier device can be preformed based on the signals generated between the two terminals of the data carrier device, the signals of the data carrier driving device and the data carrier device may have any configurations.

As mentioned above, according to the first and the second embodiments, a two-line contact type data communication system including a data carrier device and a driving device of the data carrier device which perform data communication through a first and a second contacts is provided. The data carrier driving device and the data carrier device are connected only through the two terminals of the IN terminal, which is the first contact, and the GND terminal, which is the second contact. A voltage is applied to the data carrier device from the data carrier driving device through the IN terminal, and the GND terminal, which is the second contact, is grounded. The data carrier device generates the power source of all circuits with the voltage applied from the IN terminal. A clock generator circuit generates a clock signal which has a correlation to the voltage applied from the IN terminal. A duty discriminator circuit generates a data signal which has a correlation in the voltage applied from the IN terminal. An internal circuit uses a signal output from a clock generator circuit as a clock signal, and uses a signal output from the duty discriminator circuit as a data signal. The internal circuit performs data communication based on these signals.

A system can be miniaturized by making two-way data communication possible through two contacts. Moreover, the data carrier device and the driving device of the data carrier device which enables stable data communication difficult to perform a malfunction can be realized in a simple circuit configuration which does not need strict accuracy.

Incidentally, any of the embodiments are only examples of implementing the present invention, and the technical range of the present invention must not be interpreted to be limited to those embodiments. That is, the present invention can be implemented in various forms without departing from the technical ideas and the chief features of the invention.

Third Embodiment

Figure 8:
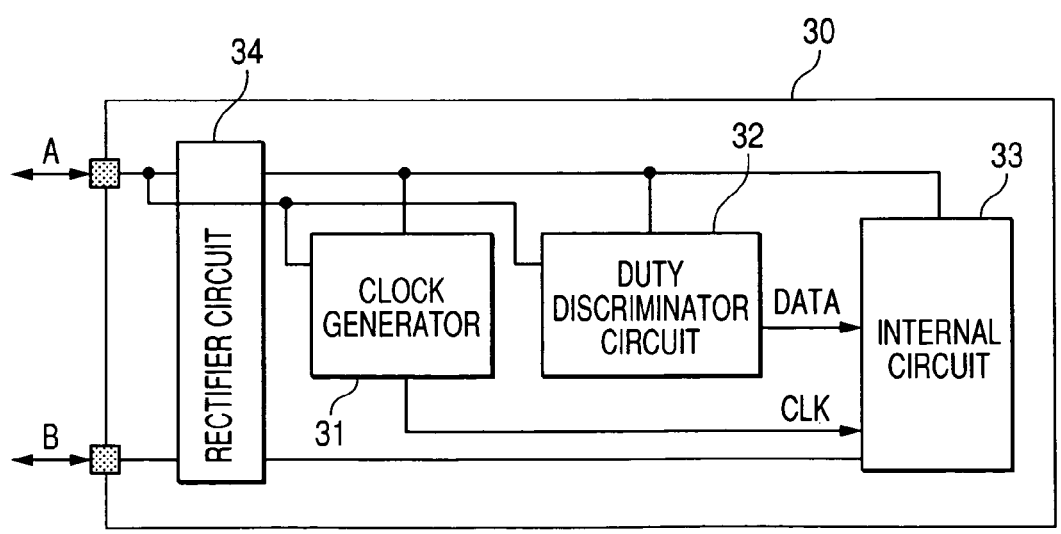
FIG. 8 is a diagram showing an example of the configuration of a data carrier device according to a third embodiment of the present invention.

FIG. 8 is a block diagram showing an example of the configuration of a data carrier device 30 according to a third embodiment of the present invention. In FIG. 8, the reference numeral 30 denotes the data carrier device performing data communication with a not shown control device (also referred to as a data carrier driving device) through two contacts, and the data carrier device 30 includes two terminals of an A terminal and a B terminal. In the data carrier device 30, a rectifier circuit 34 receives the input of a pulse voltage input from the A terminal and the B terminal, and generates a power source voltage of a constant voltage based on the pulse voltage. The rectifier circuit 34 supplies the power source voltage of all the circuits constituting the data carrier device 30. Thereby, the power source voltage of a stable constant voltage can be generated. Moreover, the data carrier device 30 is composed of a clock generator circuit 31, a duty discriminator circuit 32 and an internal circuit 33.

The clock generator circuit 31 generates the clock signal CLK necessary for data communication based on the signals input from the A terminal or the B terminal. The duty discriminator circuit 32 generates the data signal DATA necessary for the data communication according to the duty ratio of each pulse of the signals input from the A terminal or the B terminal. The internal circuit 33 receives the input of the clock signal CLK and the data signal DATA, and performs the data communication with the control device based on the input signals.

Figure 9:
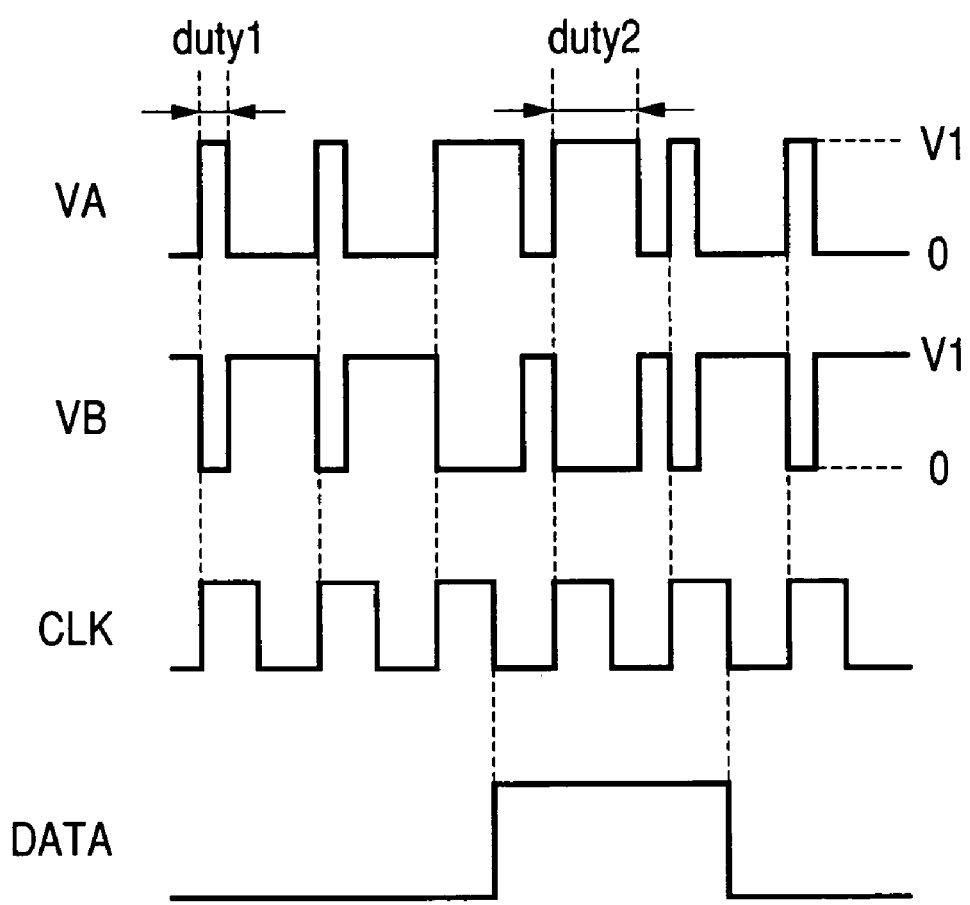
FIG. 9 is a timing chart showing the operation of the configuration of FIG. 8.

Next, the operation of the data carrier device 30 shown in FIG. 8 is described with reference to the timing chart of FIG. 9. A pulse voltage is input into the A terminal. The pulse voltage has voltage amplitudes of an H level of V1 and an L level of the GND potential. The frequency of the pulse voltage is constant. The periods (duties) of the H level of the pulses are duty 1 and duty 2. The pulse of the duty 1 and the pulse of the duty 2 are different from each other in the duty ratio. Moreover, a pulse voltage VB having the same frequency as that of the pulse voltage VA input into the A terminal and a phase in a reversed phase relation with that of the pulse voltage VA is input into the residual other B terminal. That is, the pulse signals of the mutually reversed phases are input as two terminal input from the control device into the A terminal and the B terminal. Here, the clock generator circuit 31 of FIG. 8 generates the clock signal CLK the rise of which is synchronized with the pulse voltage VA (for example, the rise of the pulse voltage VA) input into the A terminal. The frequency of the clock signal CLK is the same frequency as the frequency of the pulse voltage VA.

Moreover, the duty discriminator circuit 32 of FIG. 8 discriminates whether the H level period (duty) of the pulse voltage input into the A terminal or the B terminal is the duty 1 or the duty 2, and generates a signal corresponding to the duty ratio as the data signal DATA. When the voltage VA of the A terminal is the H level at a fall time of the clock signal CLK, the data signal DATA keeps to output the H level, and when the voltage VA of the A terminal is the L level at a fall time of the clock signal CLK, the data signal DATA keeps to output the L level. By inputting the clock signal CLK and the data signal DATA generated in such a way into the internal circuit 33, the internal circuit 33 performs the data communication with the control device.

As described above, the data carrier device 30 of FIG. 8 does not employ the method of generating a data signal by the frequency control, which is adopted in the conventional data carrier device performing data communication only by two terminals. In the present data carrier device 30, the clock signal CLK generated by the clock generator circuit 31 is completely synchronized with the frequency of the pulse voltage input into the A terminal or the B terminal, and has an always fixed frequency. Because the frequency of the clock signal CLK input into the internal circuit 33 is thereby constant, the transient characteristic of the internal circuit 33 becomes a fixed one corresponding to the set frequency. Consequently, a redundant circuit for performing a circuit operation stable over a wide frequency range becomes unnecessary, and it becomes possible to make the system inexpensive.

Moreover, the frequency of the clock signal CLK generated by the clock generator circuit 31 of the data carrier device 30 can be made to agree with the frequency of the pulse voltage input from the control device into the A terminal or the B terminal of the data carrier device 30. Consequently, even when the set value of the pulse voltage input from the control device into the A terminal or the B terminal of the data carrier device 30 is altered, it is unnecessary to perform strict timing design and the like, and it becomes possible to simplify the whole system as a result.

Moreover, generally, the control device is frequently composed of a general purpose microcomputer. The frequency of the clock signal for driving the microcomputer is a very high frequency of the order of MHz or more. The clock signal is sufficiently higher frequency as compared with the frequency of the pulse voltage input from the control device into the A terminal or the B terminal of the data carrier device 30. Accordingly, using the clock signal for driving the microcomputer would simplify the control of the duty ratio of the pulse voltage input from the control device into the A terminal or the B terminal of the data carrier device 30. Also as to this point, it can be said that the performance of the strict timing design and the like is unnecessary, and that it makes it possible to simplify the system design of the whole.

Fourth Embodiment

Figure 10:
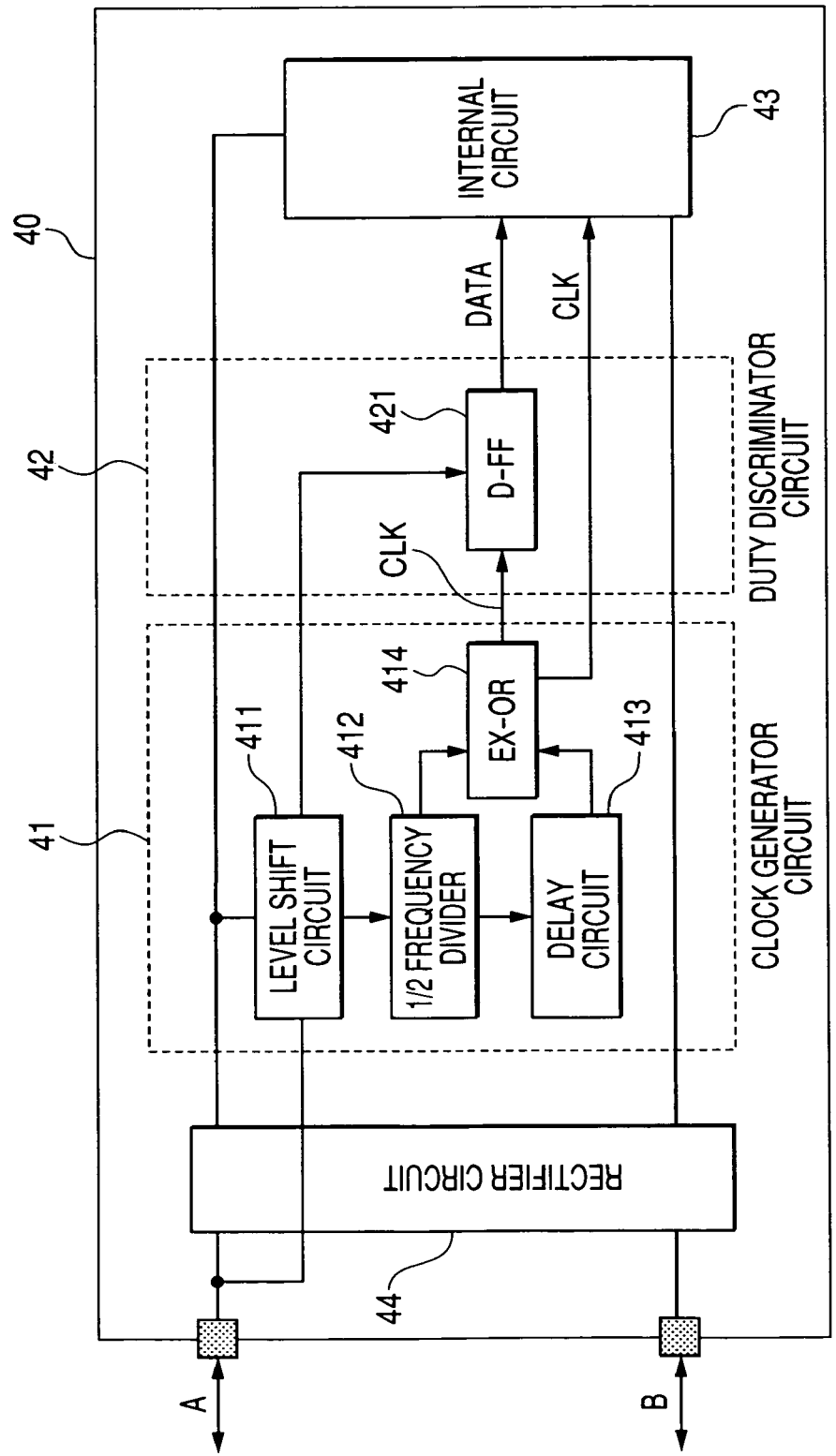
FIG. 10 is a diagram showing an example of the configuration of a data carrier device according to a fourth embodiment of the present invention.

FIG. 10 is a block diagram showing an example of the configuration of a data carrier device 40 according to a fourth embodiment of the present invention. The present embodiment shows the third embodiment still more concretely. In FIG. 10, the reference numeral 40 denotes the data carrier device performing data communication with the control device through two contacts, and the data carrier device 40 includes two terminals of an A terminal and a B terminal. The data carrier device 40 receives the input of pulse voltages VA and VB input through the A terminal and the B terminal, and generates the power sources of all the circuits constituting the data carrier device 40 from a constant voltage generated therein. Moreover, the data carrier device 40 is composed of a clock generator circuit 41, a duty discriminator circuit 42 and an internal circuit 43.

The clock generator circuit 41 generates a clock signal CLK necessary for data communication from a signal input through the A terminal or the B terminal. The duty discriminator circuit 42 generates data signal DATA necessary for the data communication from the signal input through the A terminal or the B terminal. The internal circuit 43 receives the input of the clock signal CLK and the data signal DATA, and performs the data communication with the control device based on the input signals.

Hereupon, the clock generator circuit 41 is composed of a level shift circuit 411, a ½ frequency divider circuit 412, a delay circuit 413 and an EX-OR circuit 414 as an example of a concrete circuit.

The level shift circuit 411 converts the voltage amplitude of the pulse voltage VA input from the control device into the A terminal of the data carrier device 40. The ½ frequency divider circuit 412 performs the ½ frequency division of the signal from the level shift circuit 411. The delay circuit 413 delays the signal from the ½ frequency divider circuit 412. The EX-OR (exclusive or) arithmetic circuit 414 receives the input of the two signals from the ½ frequency divider circuit 412 and the delay circuit 413, and performs the EX-OR (exclusive or) operation of the two signals to output the operation result as the clock signal CLK for making the internal circuit 43 operate.

Moreover, the duty discriminator circuit 42 is composed of a D flip-flop circuit 421 as an example of a concrete circuit.

The D flip-flop circuit 421 operates using a signal from the EX-OR circuit 414 as the clock signal CLK, and receives the input of a signal from the level shift circuit 411. Consequently, the D flip-flop circuit 421 judges whether the signal from the level shift circuit 411 has the H level or the L level. Then, the D flip-flop circuit 421 outputs an output signal corresponding to the signal level as the data signal DATA for performing the data communication with the control device.

Figure 11:
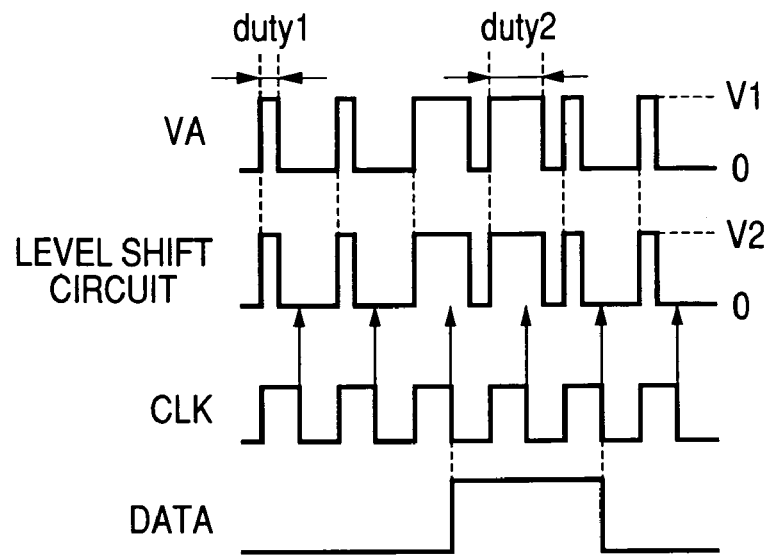
FIG. 11 is a timing chart showing the operation of the configuration of FIG. 10.

Next, the operation of the data carrier device 40 in FIG. 10 is described by using the timing chart of FIG. 11. A pulse voltage VA is input into the A terminal. The pulse voltage VA has voltage amplitudes of an H level of V1 and an L level of the GND potential. The frequency of the pulse voltage is constant. The periods (duties) of the H level of the pulses are duty 1 and duty 2. Moreover, a pulse voltage VB having the same frequency as that of the pulse voltage VA input into the A terminal and a phase in a reversed phase relation with that of the pulse voltage VA is input into the residual other B terminal. The level shift circuit 411 performs the voltage amplitude conversion of the pulse voltage VA input into the A terminal so that, for example, the H level may become V2 and the L level may become the GND potential.

Figure 12:
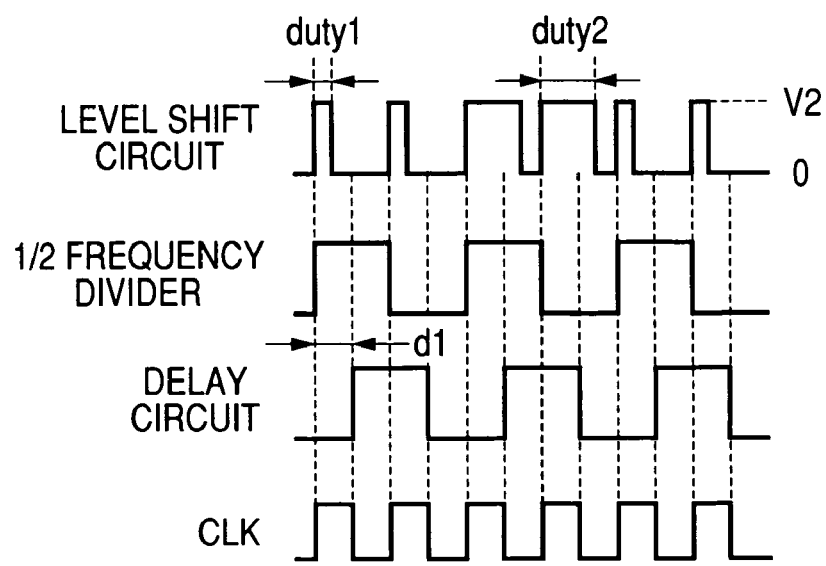
FIG. 12 is a timing chart showing the operation of a clock generator circuit of FIG. 10.

Here, the operation of the clock generator circuit 41 is described using the timing chart of FIG. 12. The ½ frequency divider circuit 412 performs the ½ frequency division of the output signal from the level shift circuit 411. The H level and the L level of an output signal from the ½ frequency divider circuit 412 is changed with each other in synchronization with a rise of the output signal from the level shift circuit 411. Consequently, the frequency of the output signal from the ½ frequency divider circuit 412 is set pursuant to only the frequency of the output signal from the level shift circuit 411.

Next, the delay circuit 413 receives the input of the output signal from the ½ frequency divider circuit 412, and delays the received signal by a certain delay time d1 to output the delayed signal. The EX-OR circuit 414 receives the input of the output signal from the ½ frequency divider circuit 412 and the output signal from the delay circuit 413, and performs the EX-OR operation of these received signals. Consequently, the EX-OR circuit 414 can generates the clock signal CLK having the frequency according with that of the output signal from the level shift circuit 411 and synchronizing with the timing of a rise of the output signal from the level shift circuit 411. For example, the delay time d1 is set to be ½ of the period of the pulse voltage VA input from the data carrier driving device 24 into the A terminal of the data carrier device 40. In this case, the EX-OR circuit 414 can generates the clock signal CLK having the same frequency as that of the pulse voltage VA input into the A terminal and a duty ratio of 50%.

Next, the output signal from the EX-OR circuit 414 and the signal from the level shift circuit 411 are input into the D flip-flop circuit 421, which is the duty discriminator circuit 42, as the clock signal CLK and the input signal, respectively. Here, as shown in the timing chart of FIG. 11, the D flip-flop circuit 421 uses the trailing edges of the clock signal CLK as the clock signal. Then, the D flip-flop circuit 421 outputs the data signal DATA in response to whether the signal from the level shift circuit 411 is the H level or the and L level in synchronization with a fall of the clock signal CLK. For example, when the signal from the level shift circuit 411 is the H level, the output signal of the D flip-flop circuit 421 takes the H level. When the signal from the level shift circuit 411 is the L level, the output signal of the D flip-flop circuit 421 takes the L level. In such a way, the output signal DATA of the D flip-flop circuit 421 changes. It is the duty ratio of the pulse voltage VA input from the control device into the A terminal of the data carrier device 40 that determines the signal level of the signal from the level shift circuit 411 to be the H level or the L level at the trailing edges of the clock signal CLK. The switching of the output signal DATA of the D flip-flop circuit 421 is in response to the switching of the duty ratio of the pulse voltage VA input into the A terminal. The duty ratio of the pulse voltage VA input into the A terminal as the data signal from the control device is controlled, and the duty ratio is discriminated by the D flip-flop circuit 421. Consequently, it becomes possible to use the output signal DATA as the data reception signal from the control device.

By inputting the thus generated clock signal CLK, the output signal from the clock generator circuit 41, and the data signal DATA, the output signal from the duty discriminator circuit 42, into the internal circuit 43 of FIG. 10, the data communication with the control device can be performed.

Here, the rectifier circuit which rectifies the pulse voltage VA input into the A terminal and the pulse voltage VB input into the B terminal is described.

Figure 20:
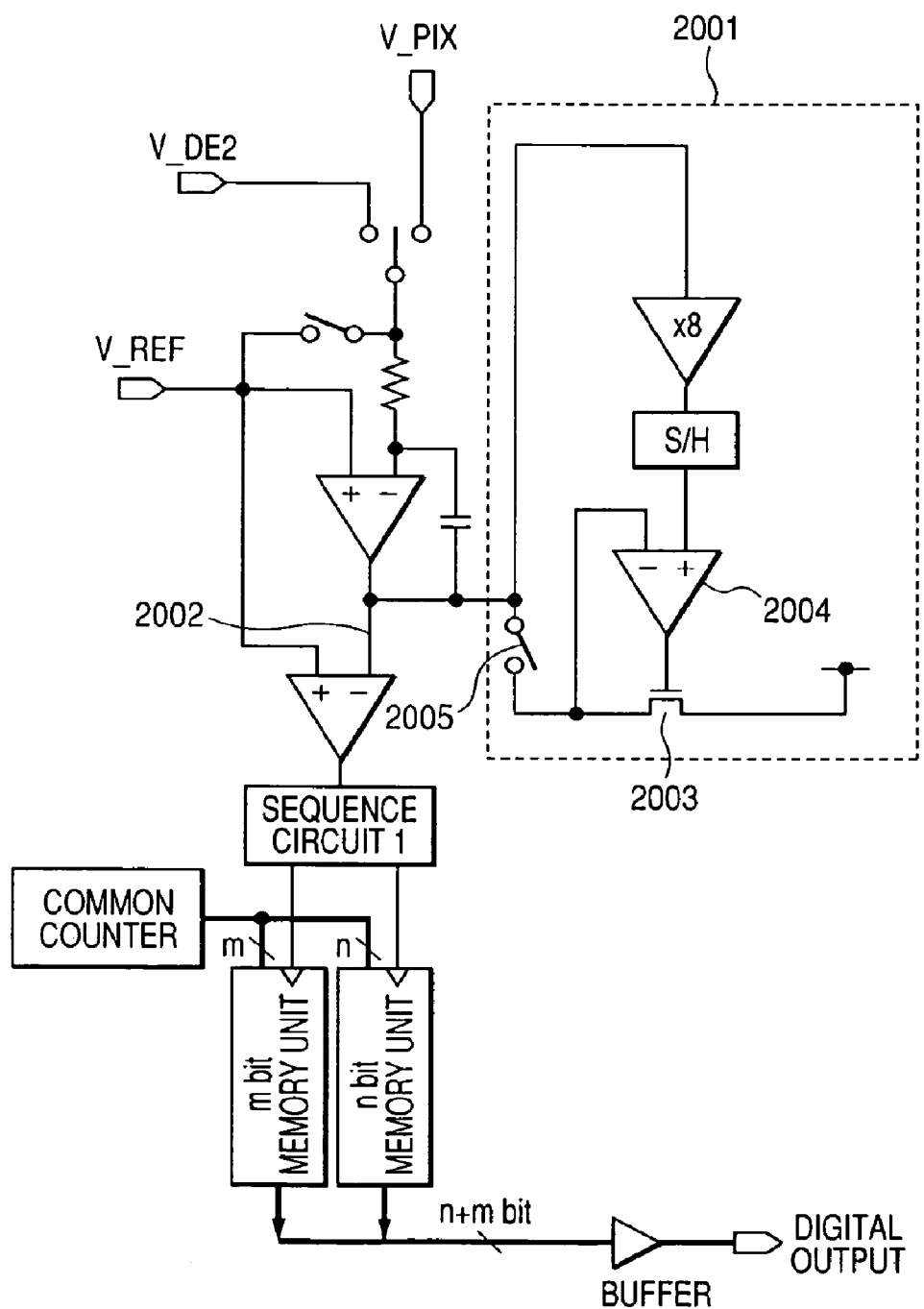
FIG. 20 is a diagram showing an example of the circuit configuration of a conventional rectifier circuit.

A conventional rectifier circuit is first shown in FIG. 20. The rectifier circuit includes an A terminal and a B terminal as input terminals, and has a function of rectifying each of the pulse voltages input through the terminals to generate a constant voltage between capacity 1105 connected between a VDD terminal (power source terminal) and a VSS terminal (power source reference terminal). Here, the drain terminal of a PMOS transistor 1103, the drain terminal of an NMOS transistor 1104, the gate terminal of a PMOS transistor 1101, and the gate terminal of an NMOS transistor 1102 are connected to the A terminal.

Incidentally, the PMOS transistor is a P channel MOS field effect transistor, and the NMOS transistor is an N channel MOS field effect transistor.

The source terminal of the PMOS transistor 1103 is connected to the VDD terminal, and the source terminal of the NMOS transistor 1104 is connected to the VSS terminal. Moreover, the drain terminal of the PMOS transistor 1101, the drain terminal of the NMOS transistor 1102, the gate terminal of the PMOS transistor 1103, and the gate terminal of the NMOS transistor 1104 are connected to the B terminal. The source terminal of the PMOS transistor 1101 is connected to the VDD terminal, and the source terminal of the NMOS transistor 1102 is connected to the VSS terminal.

Here, the operation of the rectifier circuit of FIG. 20 is described. Here, a case where the voltage of the H level of the pulse voltage is applied to the A terminal and the voltage of the L level of the pulse voltage is applied to the B terminal is considered. In this case, because the voltage of the H level is applied to the A terminal, the NMOS transistor 1102 is turned on, and the voltage of the VSS terminal becomes the same potential as that of the L level voltage applied to the B terminal. Similarly, because the voltage of the L level is applied to the B terminal, the PMOS transistor 1103 is turned on, and the voltage of the VDD terminal becomes the same potential as that of the H level voltage applied to the A terminal.

Moreover, a case where the voltage of the L level of the pulse voltage is applied to the A terminal and the voltage of the H level of the pulse voltage is applied to the B terminal. In this case, because the voltage of the L level is applied to the A terminal, the PMOS transistor 1101 is turned on, and the voltage of the VDD terminal becomes the same potential as that of the H level voltage applied to the B terminal. Similarly, because the voltage of the H level is applied to the B terminal, the NMOS transistor 1104 is turned on and the voltage of the VSS terminal becomes the same potential as that of the L level voltage applied to the A terminal.

In such a way, the pulse voltages having the phases reverse to each other are applied to the A terminal and the B terminal, and the PMOS transistor 1101, the NMOS transistor 1102, the PMOS transistor 1103 and the NMOS transistor 1104 are controlled to be ON and OFF one by one. Consequently, the voltage of the H level applied to the A terminal and the B terminal is set as the voltage of the VDD terminal, and the voltage of the L level applied to the A terminal and the B terminal is set as voltage of the VSS terminal, respectively. It thereby becomes possible to generate a constant voltage over the capacity 1105 connected between the VDD terminal and the VSS terminal.

Here, the operation when a phase difference occurs in the pulse signal applied to the A terminal and the B terminal is described. First, a case where the voltage of the H level is applied to the A terminal and the B terminal is considered. In this case, because the NMOS transistor 1102 and the NMOS transistor 1104 are turned on, the voltage of the VSS terminal becomes the same potential as that of the H level voltage applied to the A terminal and the B terminal, and becomes the same potential as the voltage of the VDD terminal. Consequently, the VSS terminal becomes the state in which the VSS terminal is shorted to the VDD terminal. Moreover, a case where the voltage of the L level is applied to the A terminal and the B terminal is considered. Because the PMOS transistor 1101 and the PMOS transistor 1103 are turned on, the voltage of the VDD terminal becomes the same potential as the L level voltage applied to the A terminal and the B terminal, and becomes the same potential as that of the voltage of the VSS terminal. Consequently, the VDD terminal becomes the state in which the VDD terminal is shorted with the VSS terminal. Thus, in the conventional rectifier circuit shown in FIG. 20, when a phase difference occurred in the pulse signals applied to the A terminal and the B terminal, the VDD terminal and the VSS terminal are changed into the shorted state.

Figure 13:
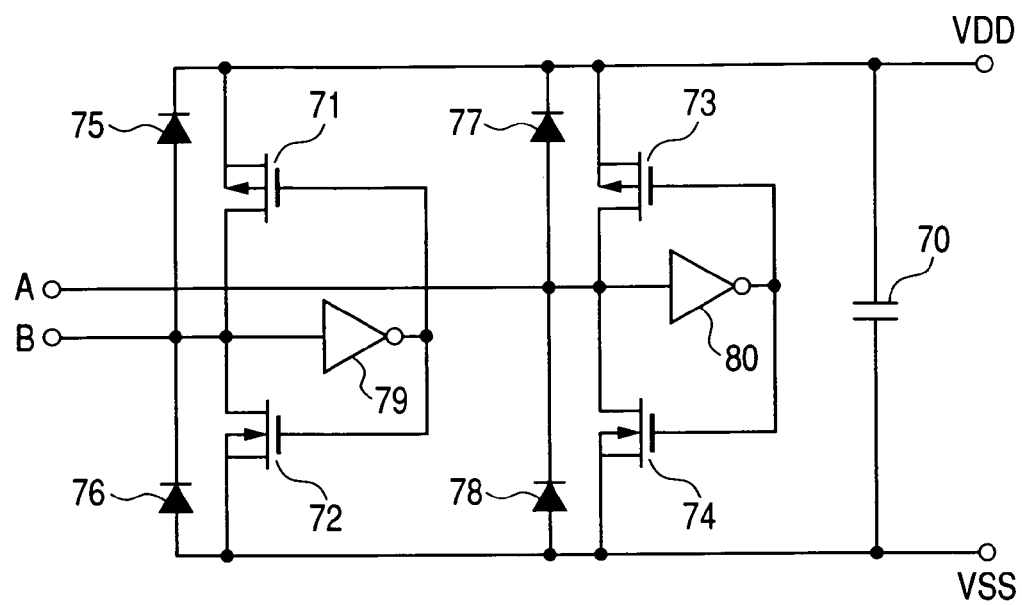
FIG. 13 is a diagram showing a first example of the circuit configuration of a rectifier circuit of FIG. 10.
Figure 14:
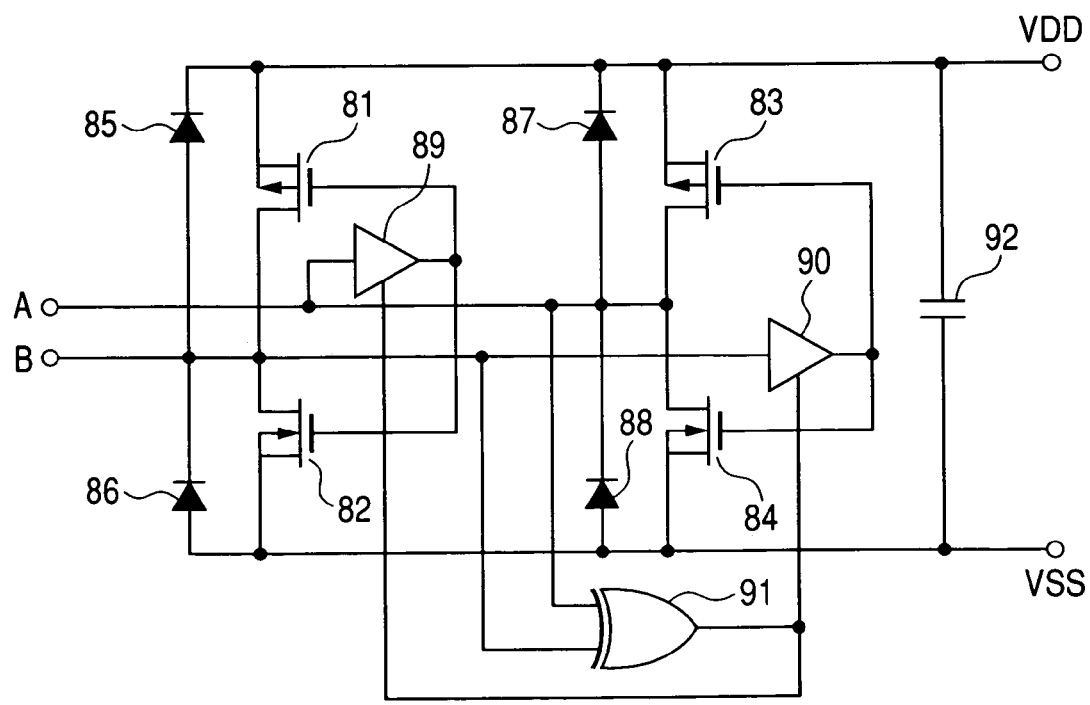
FIG. 14 is a diagram showing a second example of the circuit configuration of the rectifier circuit of FIG. 10.
Figure 15:
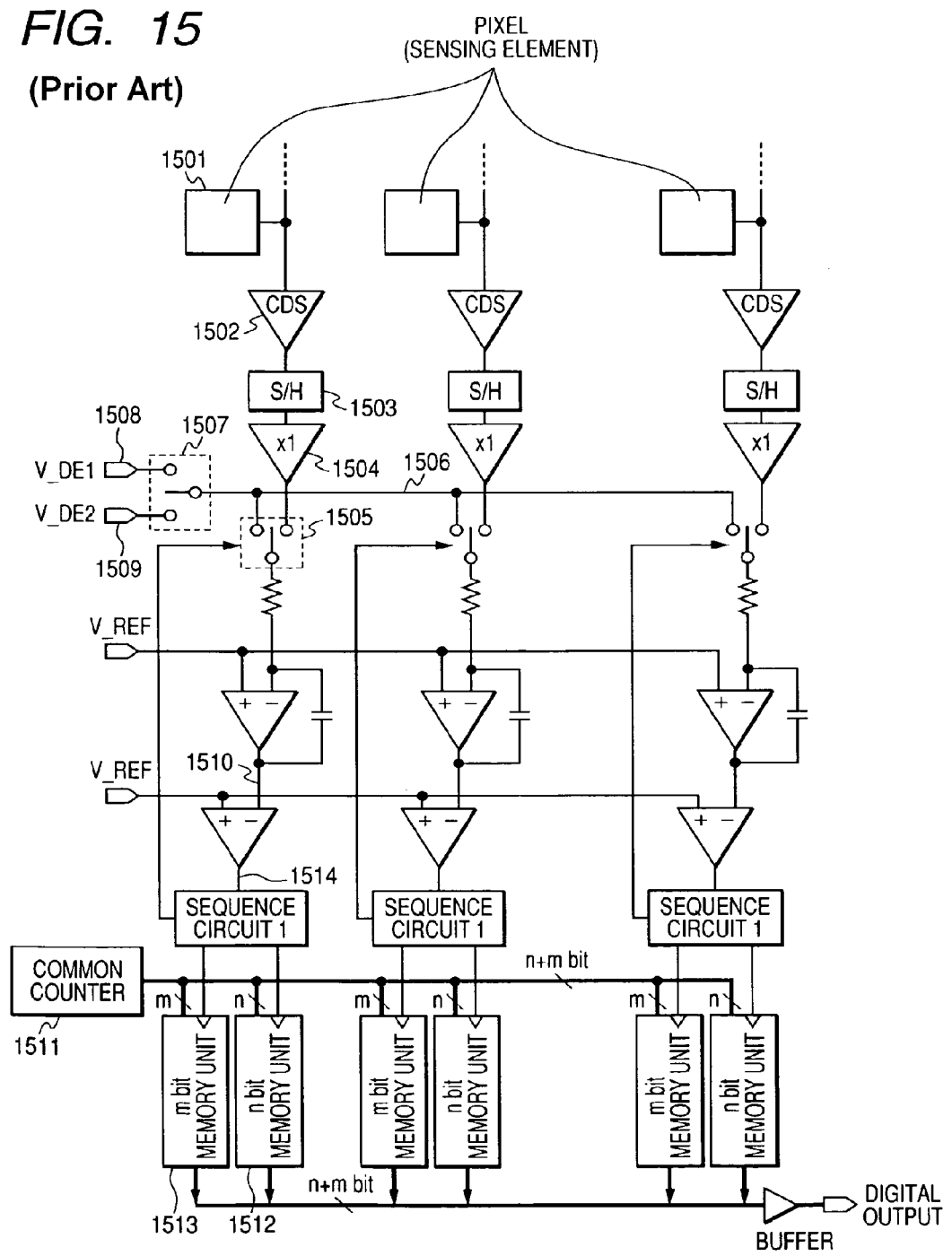
FIG. 15 is a diagram showing an example of the configuration of a conventional data communication system.
Figure 16:
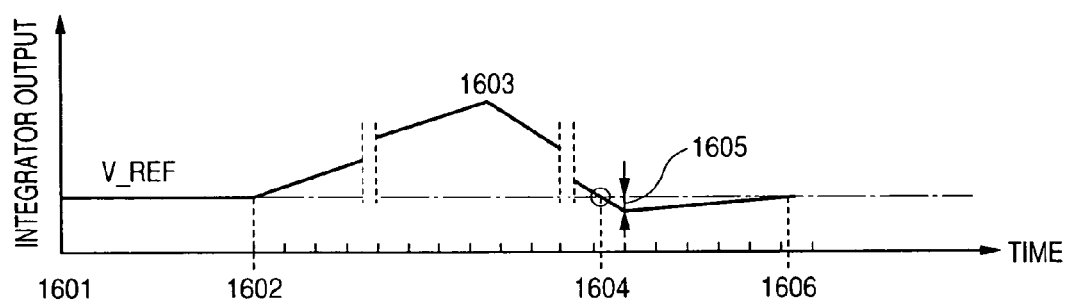
FIG. 16 is a diagram showing an example of the configuration of a conventional data communication system operating with two contacts.
Figure 17:
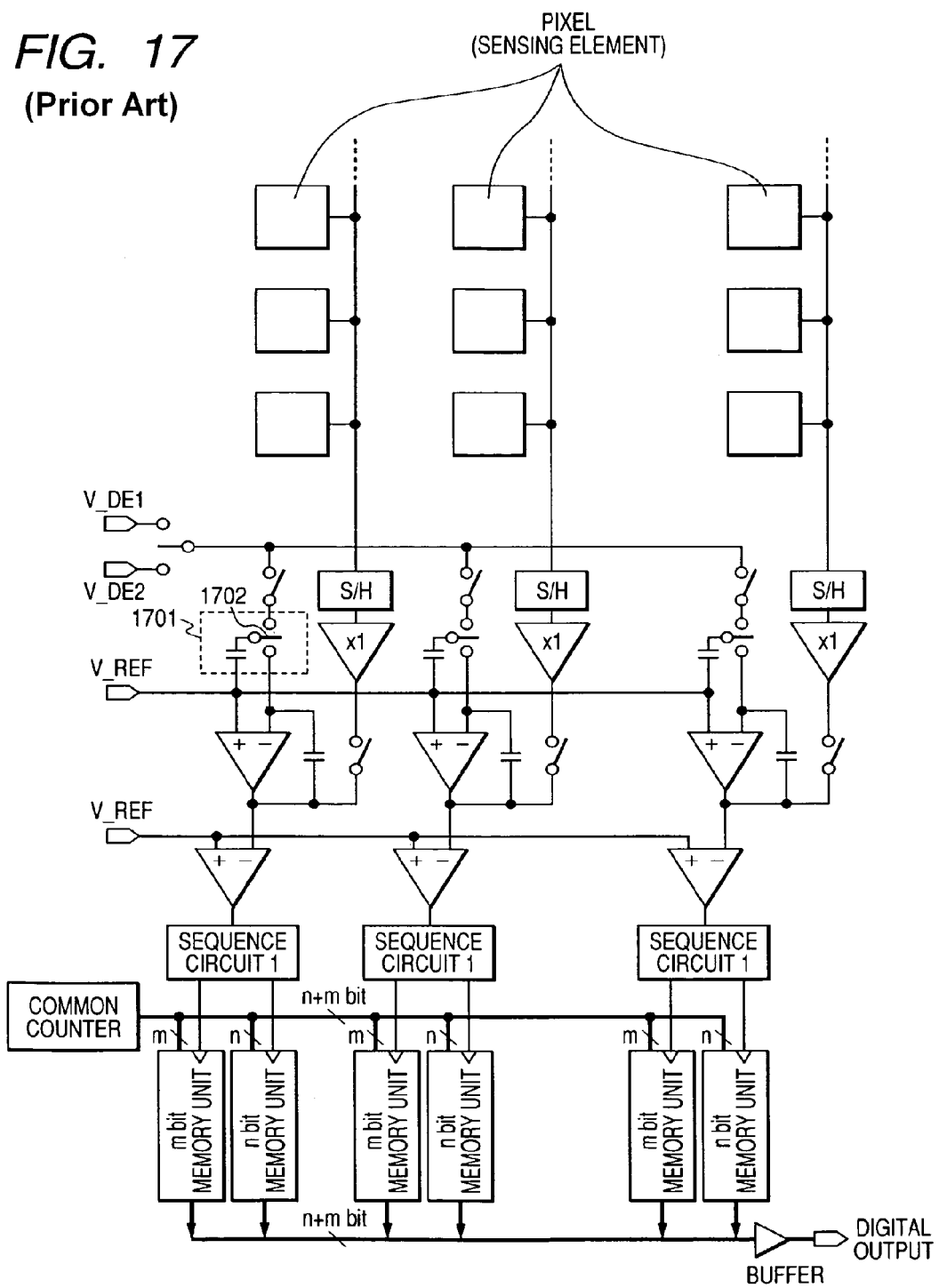
FIG. 17 is a timing chart showing the operation of the configuration of FIG. 16.
Figure 18:
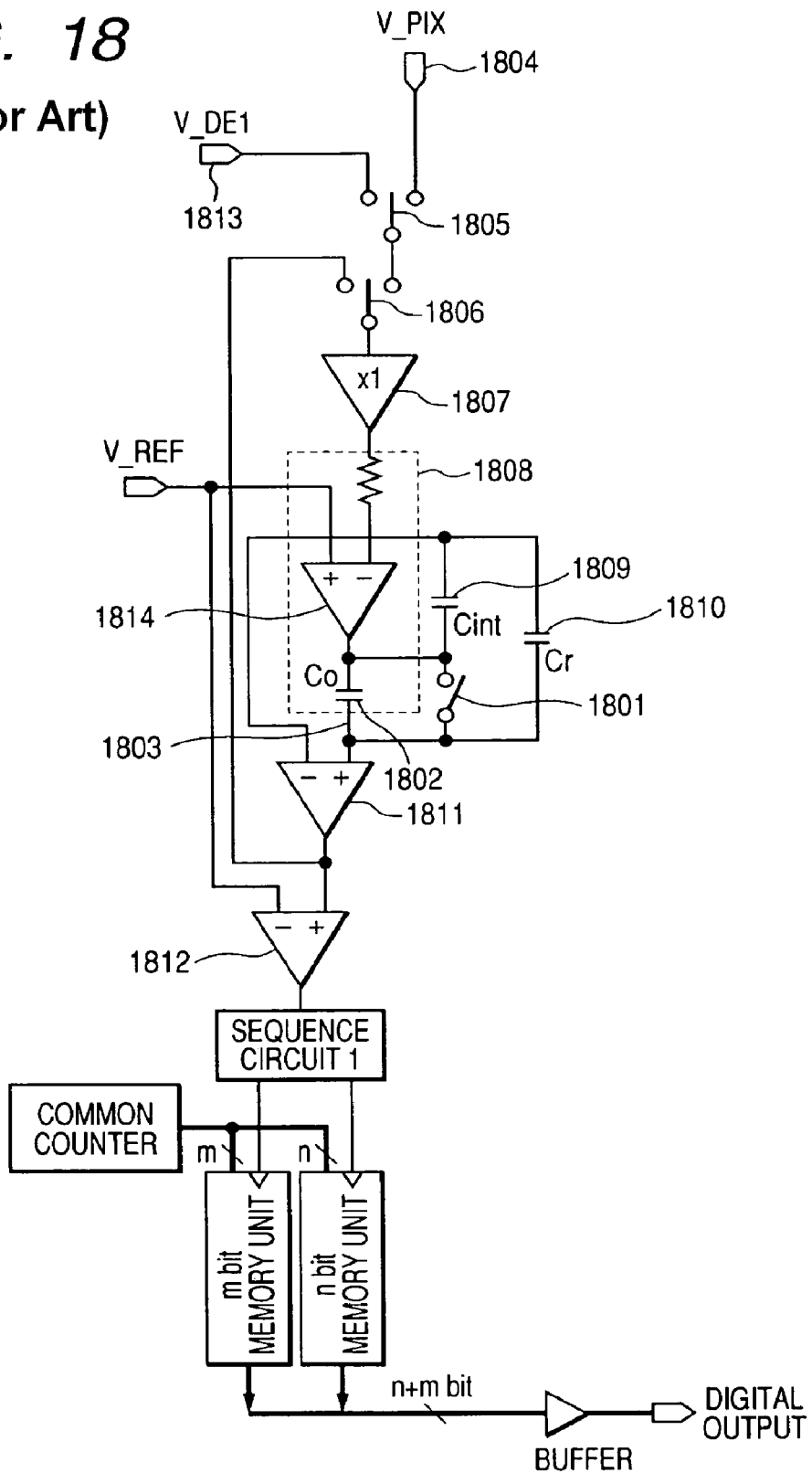
FIG. 18 is a diagram showing another example of the configuration of the conventional data communication system operating with two contacts.
Figure 19:
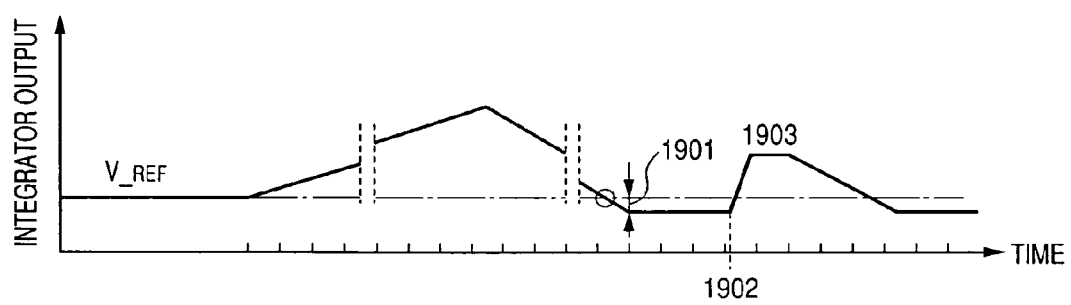
FIG. 19 is a timing chart showing the operation of the configuration of FIG. 18.

Examples of the circuit configurations of the rectifier circuits by the present embodiment are shown in FIGS. 13 and 14. These circuit configurations have an object of providing the rectifier circuits capable of sufficiently stable circuit operations by avoiding the shorted state between the VDD terminal and the VSS terminal when a phase difference occurs in the pulse signals applied to the A terminal and the B terminal, and by generating a stable constant voltage (power source voltage).

First, the rectifier circuit shown in FIG. 13 is described. The rectifier circuit shown in FIG. 13 includes the A terminal and the B terminal as the input terminals, and a function of rectifying each pulse voltage input from the input terminals to generate a constant voltage between the capacity 70 connected between the VDD terminal and the VSS terminal. In addition, the rectifier circuit has an inverter circuit 79 and an inverter circuit 80 as malfunction prevention circuits at the time of the occurrence of a phase difference in the pulse voltages applied to the A terminal and the B terminal. Here, the drain terminal of a PMOS transistor 73, the drain terminal of a NMOS transistor 74, the input terminal of the inverter circuit 80, the anode terminal of a diode 77, and the cathode terminal of a diode 78 are connected to the A terminal. The output terminal of the inverter circuit 80 is connected to the gate terminal of the PMOS transistor 73, and the gate terminal of the NMOS transistor 74. The source terminal of the PMOS transistor 73 is connected to the VDD terminal, and the source terminal of the NMOS transistor 74 is connected to the VSS terminal. The VDD terminal is connected to the cathode terminal of the diode 77, and the VSS terminal is connected to the anode terminal of the diode 78. Similarly, the drain terminal of a PMOS transistor 71, the drain terminal of an NMOS transistor 72, the input terminal of the inverter circuit 79, the anode terminal of the diode 75, and the cathode terminal of the diode 77 are connected to the B terminal. The output terminal of the inverter circuit 79 is connected to the gate terminal of the PMOS transistor 71 and the gate terminal of the NMOS transistor 72. The source terminal of the PMOS transistor 71 is connected to the VDD terminal, and the source terminal of the NMOS transistor 72 is connected to the VSS terminal. The VDD terminal is connected to the cathode terminal of the diode 75, and the VSS terminal is connected to the anode terminal of a diode 76.

The operation of the rectifier circuit of FIG. 13 is described. Here, a case where the voltage of the H level of the pulse voltage is applied to the A terminal and the voltage of the L level of the pulse voltage is applied to the B terminal is considered. In this case, the voltages of the VDD terminal and the VSS terminal before applying the voltages to the A terminal and the B terminal are undefined. However, when the voltage of the H level is applied to the A terminal, the voltage of the VDD terminal becomes a voltage produced by subtracting the forward voltage of the diode 77 from the H level voltage of the A terminal by the diode 77. When the voltage of the L level is applied to the B terminal, the voltage of the VSS terminal becomes a voltage produced by adding the forward voltage of the diode 76 to the L level voltage of the B terminal by the diode 76. Next, because the voltage of the H level is applied to the A terminal, the output terminal of the inverter circuit 80 becomes the same potential as that of the VSS terminal, and thereby the gate-source voltage of the PMOS transistor 73 becomes a voltage sufficient for turning on the PMOS transistor 73. By the turning on of the PMOS transistor 73, the voltage of the VDD terminal becomes the same potential as that of the H level voltage applied to the A terminal. Similarly, because the voltage of the L level is applied to the B terminal, the output terminal of the inverter circuit 79 becomes the same potential as that of the VDD terminal. Thereby, the gate-source voltage of the NMOS transistor 72 becomes a voltage sufficient for the NMOS transistor 72 to be turned on. By the turning on of the NMOS transistor 72, the voltage of the VSS terminal becomes the same potential as that of the L level voltage applied to the B terminal.

Moreover, a case where the voltage of the L level of the pulse voltage is applied to the A terminal and the voltage of the H level of the pulse voltage is applied to the B terminal is considered. In this case, the voltages of the VDD terminal and the VSS terminal before voltages are applied to the A terminal and the B terminal are undefined. However, when the voltage of the H level is applied to the B terminal, the voltage of the VDD terminal becomes a voltage produced by subtracting the forward voltage of the diode 75 from the H level voltage of the B terminal by the diode 75. When the voltage of the L level is applied to the A terminal, the voltage of the VSS terminal becomes a voltage produced by adding the forward voltage of the diode 78 to the L level voltage of the A terminal by the diode 78. Next, because the voltage of the H level is applied to the B terminal, the output terminal of the inverter circuit 79 becomes the same potential as that of the VSS terminal, and thereby the gate-source voltage of the PMOS transistor 71 becomes a voltage sufficient for the PMOS transistor 71 to be turned on. By the turning on of the PMOS transistor 71, the voltage of the VDD terminal becomes the same potential as that of the H level voltage applied to the B terminal. Similarly, because the voltage of the L level is applied to the A terminal, the output terminal of the inverter circuit 80 becomes the same potential as that of the VDD terminal, and thereby the gate-source voltage of the NMOS transistor 74 becomes a voltage sufficient for the NMOS transistor 74 to be turned on. By the turning on of the NMOS transistor 74, the voltage of the VSS terminal becomes the same potential as that of the L level voltage applied to the A terminal.

In such a way, the pulse voltages having a phase reversed to each other are applied to the A terminal and the B terminal, and the PMOS transistor 71, the NMOS transistor 72, the PMOS transistor 73 and the NMOS transistor 74 are controlled to be ON and OFF one by one. Thereby, the voltages of the H level and the L level applied to the A terminal and the B terminal are set as the voltages of the VDD terminal and the VSS terminal, respectively, and it becomes possible to generate a constant voltage over the capacity 70 connected between the VDD terminal and the VSS terminal.

Here, the operation when a phase difference occurs in the pulse signals severally applied to the A terminal and the B terminal is described. First, a case where the voltage of the L level is applied to the A terminal and the B terminal is considered. In this case, because the voltage of the L level is applied to the A terminal, the output terminal of the inverter circuit 80 becomes the same potential as that of the VDD terminal. Then, the PMOS transistor 73 is turned off, and the NMOS transistor 74 is turned on. The voltage of the VSS terminal becomes the same potential as that of the L level voltage applied to the A terminal. Similarly, because the voltage of the L level is applied to the B terminal, the output terminal of the inverter circuit 79 becomes the same potential as that of the VDD terminal. Then, the PMOS transistor 71 turns off, and the NMOS transistor 72 turns on. The voltage of the VSS terminal become the same potential as that of the L level voltage applied to the B terminal. Thereby, the voltage of the VSS terminal is set to the same potential as that of the L level voltage of the pulse signal applied to the A terminal and the B terminal. Because both of the PMOS transistor 71 and the PMOS transistor 73 are turned off, the voltage of the VDD terminal holds the voltage of the H level of the pulse signal applied to the A terminal and the B terminal by the capacity 70 connected between the VDD terminal and the VSS terminal.

Next, a case where the voltage of the H level is applied to the A terminal and the B terminal is considered. In this case, because the voltage of the H level is applied to the A terminal, the output terminal of the inverter circuit 80 becomes the same potential as that of the VSS terminal. The PMOS transistor 73 is turned on, and the NMOS transistor 74 is turned off. The voltage of the VDD terminal becomes the same potential as that of the H level voltage applied to the A terminal. Similarly, because the voltage of the H level is applied to the B terminal, the output terminal of the inverter circuit 79 becomes the same potential as that of the VSS terminal. PMOS transistor 71 is turned on, and the NMOS transistor 72 is turned off. The voltage of the VDD terminal becomes the same potential as that of the H level voltage applied to the B terminal. Thereby, the voltage of the VDD terminal is set to be the same potential as that of the H level voltage of the pulse signal applied to the A terminal and the B terminal. Because both of the NMOS transistor 72 and the NMOS transistor 74 are turned off, the voltage of the VSS terminal holds the voltage of the L level of the pulse signal applied to the A terminal and the B terminal by the capacity 70 connected between the VDD terminal and the VSS terminal.

In this way, even when a phase difference occurs between the pulse signals applied to the A terminal and the B terminal in the rectifier circuit shown in FIG. 13 at the time of an actual system operation, the voltages of the VDD terminal and the VSS terminal do not cause any voltage drop by the short of the internal circuit. Consequently, it becomes possible to generate a stable constant voltage.

Next, the other rectifier circuit shown in FIG. 14 is described. The rectifier circuit shown in FIG. 14 includes the A terminal and the B terminal as the input terminals, and a function of rectifying each pulse voltage input from the input terminals to generate a constant voltage between a capacity 92 connected between the VDD terminal and the VSS terminal.

In addition, the rectifier circuit has an three-state buffer circuit 89 and an three-state buffer circuit 90 as malfunction prevention circuits at the time of the occurrence of a phase difference in the pulse voltages applied to the A terminal and the B terminal. The drain terminal of a PMOS transistor 83, the drain terminal of an NMOS transistor 84, the input terminal of the three-state buffer circuit 89 and the input terminal of an EX-OR circuit 91 is connected to the A terminal. Furthermore, the anode terminal of a diode 87, and the cathode terminal of a diode 88 are connected to the A terminal. The drain terminal of a PMOS transistor 81, the drain terminal of an NMOS transistor 82, the input terminal of the three-state buffer circuit 90, and the input terminal of the EX-OR circuit 91 are connected to the B terminal. Furthermore, the anode terminal of a diode 85 and a cathode terminal of a diode 86 are connected to the B terminal. The output terminal of the three-state buffer circuit 90 is connected to the gate terminal of the PMOS transistor 83 and the gate terminal of the NMOS transistor 84. The source terminal of the PMOS transistor 83 is connected to the VDD terminal, and the source terminal of the NMOS transistor 84 is connected to the VSS terminal. The VDD terminal is connected to the cathode terminal of the diode 87, and the VSS terminal is connected to the anode terminal of the diode 88. The output terminal of the three-state buffer circuit 89 is connected to the gate terminal of the PMOS transistor 81 and the gate terminal of the NMOS transistor 82. The source terminal of the PMOS transistor 81 is connected to the VDD terminal. The source terminal of the NMOS terminal 82 is connected to the VSS terminal. The VDD terminal is connected to the cathode terminal of the diode 85. The VSS terminal is connected to the anode terminal of the diode 86 The output terminal of the EX-OR circuit 91 is connected to the three-state buffer circuits 89 and 90.

The operation of the rectifier circuit of FIG. 14 is described. Here, it is supposed that the time when each output terminal of the three-state buffer circuits 89 and 90 outputs a high-impedance signal is the time when the pulse signals applied to the A terminal and the B terminal are the voltages having the same levels. First, a case where the voltage of the H level of the pulse voltage is applied to the A terminal and the voltage of the L level of the pulse voltage is applied to the B terminal is considered. In this case, the voltages of the VDD terminal and the VSS terminal before applying the voltages to the A terminal and the B terminal are undefined. When the voltage of the H level is applied to the A terminal, the voltage of the VDD terminal becomes a voltage produced by subtracting the forward voltage of the diode 87 from the H level voltage of the A terminal by the diode 87. When the voltage of the L level is applied to the B terminal, the voltage of the VSS terminal becomes a voltage produced by adding the forward voltage of the diode 86 to the L level voltage of the B terminal by the diode 86. Next, because the voltage of the H level is applied to the A terminal, the output terminal of the three-state buffer circuit 89 becomes the same potential as that of the VDD terminal, and thereby the gate-source voltage of the NMOS transistor 82 becomes a voltage sufficient for turning on the NMOS transistor 82. By the turning on of the NMOS transistor 82, the voltage of the VSS terminal becomes the same potential as that of the L level voltage applied to the B terminal. Similarly, because the voltage of the L level is applied to the B terminal, the output terminal of the three-state buffer circuit 90 becomes the same potential as that of the VSS terminal. Thereby, the gate-source voltage of the PMOS transistor 83 becomes a voltage sufficient for the PMOS transistor 83 to be turned on. By the turning on of the PMOS transistor 83, the voltage of the VDD terminal becomes the same potential as that of the H level voltage applied to the A terminal.

Next, a case where the voltage of the L level of the pulse voltage is applied to the A terminal and the voltage of the H level of the pulse voltage is applied to the B terminal is considered. The voltages of the VDD terminal and the VSS terminal before voltages are applied to the A terminal and the B terminal are undefined. When the voltage of the H level is applied to the B terminal, the voltage of the VDD terminal becomes a voltage produced by subtracting the forward voltage of the diode 85 from the H level voltage of the B terminal by the diode 85. When the voltage of the L level is applied to the A terminal, the voltage of the VSS terminal becomes a voltage produced by adding the forward voltage of the diode 88 to the L level voltage of the A terminal by the diode 88. Next, because the voltage of the H level is applied to the B terminal, the output terminal of the three-state buffer circuit 90 becomes the same potential as that of the VDD terminal, and thereby the gate-source voltage of the NMOS transistor 84 becomes a voltage sufficient for the NMOS transistor 84 to be turned on. By the turning on of the NMOS transistor 84, the voltage of the VSS terminal becomes the same potential as that of the L level voltage applied to the A terminal. Similarly, because the voltage of the L level is applied to the A terminal, the output terminal of the three-state buffer circuit 89 becomes the same potential as that of the VSS terminal, and thereby the gate-source voltage of the PMOS transistor 81 becomes a voltage sufficient for the PMOS transistor 81 to be turned on. By the turning on of the PMOS transistor 81, the voltage of the VDD terminal becomes the same potential as that of the H level voltage applied to the B terminal.

In such a way, the pulse voltages having a phase reversed to each other are applied to the A terminal and the B terminal, and the PMOS transistor 81, the NMOS transistor 82, the PMOS transistor 83 and the NMOS transistor 84 are controlled to be ON and OFF one by one. Thereby, the voltages of the H level and the L level applied to the A terminal and the B terminal are set as the voltages of the VDD terminal and the VSS terminal, respectively. Thereby, it becomes possible to generate a constant voltage over the capacity 92 connected between the VDD terminal and the VSS terminal.

Here, the operation when a phase difference occurs in the pulse signals severally applied to the A terminal and the B terminal is described. When a phase difference occurs in the pulse signals applied to the A terminal and the B terminal, there are two cases: a case where the voltages of the H level are applied to both of the A terminal and the B terminal, and a case where the voltages of the L level are applied to both of the A terminal and the B terminal. In both the cases, the output terminals of the three-state buffer circuits 89 and 90 are controlled so as to output high impedance signals by the signal of the output terminal of the EX-OR circuit 91. Consequently, all of the PMOS transistor 81, NMOS transistor 82, PMOS transistor 83 and the NMOS transistor 84 are turned off. Consequently, the voltage between the VDD terminal and the VSS terminal is held by the capacity 92 connected between the VDD terminal and the VSS terminal.

In this way, even when a phase difference occurs between the pulse signals applied to the A terminal and the B terminal in the rectifier circuit shown in FIG. 14 at the time of an actual system operation, the voltages of the VDD terminal and the VSS terminal do not cause any voltage drop by the short of the internal circuit. Consequently, it becomes possible to generate a stable constant voltage.

As described above, in the fourth embodiment, because almost all the circuits are composed of the logic circuits, the circuit constants are not governed in dependence on strict analog potential. Consequently, even in a system including the pulse voltages like ones input into the A terminal and the B terminal and having many nose components, sufficiently stable circuit operations are possible. Moreover, even in a circuit configuration in which a lot of noise components generated at the time when many internal circuits operate in synchronization with a clock signal exists, the sufficiently stable circuit operations become possible. Moreover, in the duty discriminator circuit 42, the delay time of the delay circuit 413 determining this timing is required only to be able to discriminate the duty ratio of the pulse voltage input from the control device into the A terminal or the B terminal of the data carrier device 40. Consequently, as long as the duty ratios of the applied pulse voltages differ from each other sufficiently large, the setting of strict delay times is not necessary, and the delay circuit can be realized by a circuit having a simple configuration.

Moreover, when a phase difference occurs in the pulse signals applied to the A terminal and the B terminal, which is produced in an actual system operation time, a stable constant voltage can be generated by the rectifier circuit according to the fourth embodiment, and a sufficiently stabilized circuit operation can be accordingly enabled.

Incidentally, in the third embodiment and the fourth embodiment, the kinds of the H level periods (duties) of the pulse voltages input into the A terminal or the B terminal of the data carrier device from the control device may be a multiple value of three or more values. If it is two values, and if these two H level periods (duties) can be discriminated easily, the two H level periods (duties) are not necessarily to be 100% when they are totaled. Moreover, the pulse voltages input into the A terminal or the B terminal of the data carrier device 30 from the control device do not necessarily have the same voltage amplitudes. As long as the power source for enabling the stable operation of the data carrier device can be supplied, the voltage amplitudes may be differ from each other.

As mentioned above, according to the third and the fourth embodiments, a two-line contact type data carrier device which performs data communication through a first and a second contacts has the following features. An external pulse voltage is applied to the A terminal, which is the first contact, and a pulse voltage having the same frequency as that of the pulse voltage applied to the A terminal and a phase in a phase relation of a reversed phase is applied to the B terminal, which is the second contact. The power source of all of the circuits is generated by the constant voltage generated by rectifying the pulse voltage applied to the A terminal or the B terminal by the rectifier circuit. The clock generator circuit generates a clock signal which has a correlation to the pulse voltage applied from the A terminal or the B terminal. The duty discriminator circuit generates a data signal which has a correlation to the voltage applied from the A terminal or the B terminal. The internal circuit uses a signal output from the clock generator circuit as the clock signal, and uses a signal output from the duty discriminator circuit as the data signal. The internal circuit performs data communication based on these signals.

A system can be miniaturized by making two-way data communication possible through two contacts. Moreover, the data carrier device and the driving device of the data carrier device which enables stable data communication difficult to perform a malfunction can be realized in a simple circuit configuration which does not need strict accuracy.

Incidentally, any of the embodiments are only examples of implementing the present invention, and the technical range of the present invention must not be interpreted to be limited to those embodiments. That is, the present invention can be implemented in various forms without departing from the technical ideas and the chief features of the invention.

This application claims priorities from Japanese Patent Application Nos. 2004-325305 filed on Nov. 9, 2004, and 2004-347074 filed on Nov. 30, 2004, which are hereby incorporated by reference herein.

What is claimed is:

1. A data communication apparatus comprising:
a signal terminal for inputting a receiving signal including portions that have different duty ratios and that have a constant pulse frequency on the whole;
a reference voltage terminal for inputting a reference voltage;
a clock generating circuit for generating a clock signal based on the receiving signal;
a data signal generating circuit for generating a data signal based on a recognition of a duty ratio of the receiving signal;
a level shift circuit for level shifting the receiving signal to produce a level shifted receiving signal, wherein the clock generating circuit generates the clock signal based on the level shifted receiving signal, and the data signal generating circuit generates the data signal based on a recognition of a duty ratio of the level shifted receiving signal; and an internal circuit for inputting the clock signal generated by said clock generating circuit and the data signal generated by said data signal generating circuit, and outputting a transmission signal to said signal terminal, wherein electric source power for said clock generating circuit, said data signal generating circuit, and said internal circuit is generated based on the receiving signal and the reference voltage.

2. The data communication apparatus according to claim 1, wherein said internal circuit outputs the transmission signal only within a time period during which the receiving signal is at a high level.

3. The data communication apparatus according to claim 1, wherein said internal circuit has a switch circuit connected to the signal terminal and controls whether a constant current is flown or not to output the transmission signal to the signal terminal.

4. The data communication apparatus according to claim 3, wherein said switch circuit is controlled to flow the constant current only within a time period during which the receiving signal inputted to said signal terminal is at the high level.

5. The data communication apparatus according to claim 1, wherein the reference voltage is a ground potential.

6. A data communication system comprising first and second data communication apparatuses connected mutually at least through a signal terminal, wherein the first data communication apparatus comprises:
a voltage amplitude modulating circuit for outputting to said second data communication apparatus through said signal terminal a transmission signal including portions that have different duty ratios and that have a constant pulse frequency on the whole; and
a current detecting circuit for generating a data signal based on the current flowing into said signal terminal, and wherein the second data communication apparatus comprises:
a reference voltage terminal for inputting a reference voltage;
a clock generating circuit for generating a clock signal based on the receiving signal inputted through said signal terminal from said first data communication apparatus;
a data signal generating circuit for generating a data signal based on a recognition of a duty ratio of the receiving signal;
an internal circuit for inputting the clock signal generated by said clock generating circuit and the data signal generated by said data signal generating circuit, and outputting a transmission signal to said signal terminal, said second data communication apparatus generating electric source power for the clock generating circuit, the data signal generating circuit, and the internal circuit based on the receiving signal and the reference voltage; and
a level shift circuit for level shifting the receiving signal to produce a level shifted receiving signal, wherein the clock generating circuit generates the clock signal based on the level shifted receiving signal, and the data signal generating circuit generates the data signal based on a recognition of a duty ratio of the level shifted receiving signal.

7. A data communication method comprising:
a receiving signal inputting step for inputting into a signal terminal a receiving signal including portions that have different duty ratios and that have a constant pulse frequency on the whole;
a reference signal inputting step for inputting a reference voltage into a reference voltage terminal;
a clock signal generating step for generating a clock signal based on the receiving signal;
a data signal generating step for generating a data signal based on a recognition of a duty ratio of the receiving signal;
a transmission signal outputting step for outputting a transmission signal to the signal terminal, wherein electric source power is generated based on the receiving signal and the reference voltage; and
a level shift step for level shifting the receiving signal to produce a level shifted receiving signal, wherein, in the clock generating step, the clock signal is generated based on the level shifted receiving signal, and, in the data signal generating step, the data signal is generated based on a recognition of a duty ratio of the level shifted receiving signal.

* * * * *